United States Patent
Saitoh et al.

(10) Patent No.: US 7,632,577 B2
(45) Date of Patent: Dec. 15, 2009

(54) ORGANIC LIGHT-EMITTING DEVICE

(75) Inventors: Akihito Saitoh, Yokohama (JP); Mizuho Hiraoka, Kawasaki (JP); Koichi Suzuki, Yokohama (JP); Akihiro Senoo, Kawasaki (JP); Hiroshi Tanabe, Yokohgama (JP); Naoki Yamada, Inagi (JP); Chika Negishi, Yokosuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 436 days.

(21) Appl. No.: 10/525,198

(22) PCT Filed: Aug. 26, 2003

(86) PCT No.: PCT/JP03/10782

§ 371 (c)(1),
(2), (4) Date: Feb. 22, 2005

(87) PCT Pub. No.: WO2004/020548

PCT Pub. Date: Mar. 11, 2004

(65) Prior Publication Data

US 2006/0068221 A1    Mar. 30, 2006

(30) Foreign Application Priority Data

Aug. 28, 2002 (JP) ............................. 2002-248354

(51) Int. Cl.
*H01L 51/54* (2006.01)
*H05B 33/14* (2006.01)

(52) U.S. Cl. ................ 428/690; 428/917; 313/504; 313/506; 257/40

(58) Field of Classification Search ................ 428/690, 428/917; 313/504, 506; 257/40
See application file for complete search history.

(56) References Cited

U.S. PATENT DOCUMENTS 4,539,507 A    9/1985    VanSlyke et al. ............ 313/504

(Continued)

FOREIGN PATENT DOCUMENTS

EP    19846768 A1    10/1998

(Continued)

OTHER PUBLICATIONS

Tang, et al., "Organic electroluminescent diodes"; Appl. Phy. Lett. vol. 51, No. 12, pp. 913-915 (1987).

(Continued)

*Primary Examiner*—D. L Tarazano
*Assistant Examiner*—Camie S Thompson
(74) *Attorney, Agent, or Firm*—Fitzpatrick, Cella, Harper & Scinto

(57) ABSTRACT

To provide an organic light-emitting device that exhibits the hue of light emission having extremely high purity and has a light output having high luminance and long life with a high degree of efficiency. The organic light-emitting device comprises at least a pair of electrodes consisting of an anode and a cathode and one or more organic compound-containing layers sandwiched between the pair of electrodes, wherein at least one of the above described organic compound-containing layers contains at least one compound selected from the group consisting of the compounds represented by the following general formula [1] and at least one compound selected from the group consisting of the compounds represented by the following general formula [2].

2 Claims, 3 Drawing Sheets

U.S. PATENT DOCUMENTS

| | | | | |
|---|---|---|---|---|
| 4,720,432 | A | 1/1988 | VanSlyke et al. | 428/457 |
| 4,885,211 | A | 12/1989 | Tang et al. | 428/457 |
| 5,077,142 | A | 12/1991 | Sakon et al. | 428/690 |
| 5,130,603 | A | 7/1992 | Tokailin et al. | 313/504 |
| 5,151,629 | A | 9/1992 | Van Slyke et al. | 313/504 |
| 5,227,252 | A | 7/1993 | Murayama et al. | 428/690 |
| 5,247,190 | A | 9/1993 | Friend et al. | 257/40 |
| 5,317,169 | A | 5/1994 | Nakana et al. | 257/40 |
| 5,382,477 | A | 1/1995 | Saito et al. | 428/690 |
| 5,409,783 | A | 4/1995 | Tang et al. | 428/690 |
| 5,514,878 | A | 5/1996 | Holmes et al. | 257/40 |
| 5,672,678 | A | 9/1997 | Holmes et al. | 528/373 |
| 5,726,457 | A | 3/1998 | Nakano et al. | 257/40 |
| 5,989,737 | A | 11/1999 | Xie et al. | 428/690 |
| 6,093,864 | A | 7/2000 | Tokailin et al. | 585/25 |
| 6,541,602 | B1 | 4/2003 | Spreitzer et al. | 528/394 |
| 6,635,364 | B1 | 10/2003 | Igarashi | 428/690 |
| 6,743,948 | B1 | 6/2004 | Hosokana et al. | 564/426 |
| 6,951,693 | B2 * | 10/2005 | Hosokawa et al. | 428/690 |
| 2003/0072966 | A1 | 4/2003 | Hosokana et al. | 428/690 |
| 2004/0253389 | A1 | 12/2004 | Suzuki et al. | 428/1.1 |
| 2004/0263067 | A1 | 12/2004 | Saitoh et al. | 313/504 |
| 2004/0265632 | A1 | 12/2004 | Okinaka et al. | 428/690 |
| 2005/0038296 | A1 | 2/2005 | Hosokawa et al. | 564/426 |
| 2005/0064233 | A1 * | 3/2005 | Matsuura et al. | 428/690 |
| 2005/0099115 | A1 | 5/2005 | Saitoh et al. | 313/504 |
| 2005/0106414 | A1 | 5/2005 | Saitoh et al. | 428/690 |
| 2005/0244670 | A1 * | 11/2005 | Saitoh et al. | 428/690 |

FOREIGN PATENT DOCUMENTS

| | | |
|---|---|---|
| JP | 02-247278 | 10/1990 |
| JP | 03-255190 | 11/1991 |
| JP | 04-145792 | 5/1992 |
| JP | 05-202356 | 8/1993 |
| JP | 05-247460 | 9/1993 |
| JP | 7-90259 | 4/1995 |
| JP | 8-259934 | 10/1996 |
| JP | 09-202878 | 8/1997 |
| JP | 09-227576 | 9/1997 |
| JP | 10-255985 | 9/1998 |
| JP | 11-312587 | 11/1999 |
| JP | 2001-052868 | 2/2001 |
| JP | 2001-118683 | 4/2001 |
| JP | 2001-192651 | 7/2001 |
| JP | 2002-50481 | 2/2002 |
| JP | 2002-212150 | 7/2002 |
| JP | 2002-237386 | 8/2002 |
| JP | 2002-527554 | 8/2002 |
| JP | 2002-34357 | 11/2002 |
| WO | WO 00/22027 | 4/2000 |

OTHER PUBLICATIONS

Burroughes, et al., "Light-emitting diodes based on conjugated polymers"; Nature, vol. 347, pp. 539-541 (Oct. 1990).

* cited by examiner

ORGANIC LIGHT-EMITTING DEVICE

TECHNICAL FIELD

The present invention relates to an organic light-emitting device, particularly to a device that emits light with the aid of the application of an electric field to a thin film comprised of an organic compound.

BACKGROUND ART

An organic light-emitting device is a device in which a thin film containing a fluorescent organic compound is sandwiched between an anode and a cathode. In the device produces, an exciton of the fluorescent compound is produced by injecting an electron or a hole from each of the electrodes and the light radiated when the exciton returns to the ground state is utilized.

In a research by Eastman Kodak Company in 1987 (Appl. Phys. Lett. 51, 913 (1987)), there is reported a light emission of about 1,000 cd/m² at an applied voltage of about 10 V for a device of separated-function two-layered structure using ITO for anode, a magnesium-silver alloy for cathode, respectively, an aluminum-quinolinol complex as an electron-transporting material, and a light-emitting material and a triphenylamine derivative as a hole transporting material. Related patents include U.S. Pat. No. 4,539,507; U.S. Pat. No. 4,720,432 and U.S. Pat. No. 4,885,211.

Light-emission from ultraviolet to infrared is possible by changing a kind of the fluorescent organic compounds and researches of various compounds therefor have been conducted actively recently. For example, they are described in U.S. Pat. No. 5,151,629; U.S. Pat. No. 5,409,783; U.S. Pat. No. 5,382,477; Japanese Patent Application Laid-Open No. H02-247278; Japanese Patent Application Laid-Open No. H03-255190; Japanese Patent Application Laid-Open No. H05-202356; Japanese Patent Application Laid-Open No. H09-202878 and Japanese Patent Application Laid-Open No. H09-227576.

Besides other than the organic light-emitting device using monomeric materials as described above, an organic light-emitting device using a conjugated polymer has been reported by a group of Cambridge University (Nature 347, 539 (1990)). In this report, the light-emission in a monolayer by forming a film of polyphenylenevinylene in a coating system is confirmed. The related patents on organic light-emitting devices using conjugated polymers include U.S. Pat. No. 5,247,190; U.S. Pat. No. 5,514,878; U.S. Pat. No. 5,672,678; Japanese Patent Application Laid-Open No. H04-145192 and Japanese Patent Application Laid-Open No. H05-247460.

Thus, recent progress in organic light-emitting devices is remarkable, and possibilities for a wide range of applications are indicated since it is characterized in that a thin and light-weight light-emitting device having high luminance at a low applied-voltage, diversity of light-emitting wavelength and high-speed response can be prepared.

However, there are numbers of problems in terms of durability such as the variation with time during use for a long period of time and the deterioration due to an atmospheric gas containing oxygen or humidity. Moreover, a light output of higher luminance, high conversion efficiency and the emission of blue, green and red light having high color purity are required under present circumstances in terms of applications such as a full-color display.

For example, Japanese Patent Application Laid-Open No. 2001-52868 discloses a diamine compound as a light-emitting material, but any emission of blue light with high color purity (chromaticity coordinates: x, y=0.14-0.15, 0.09-0.10) is not obtained. Japanese Patent Application Laid-Open No. H11-312587 discloses an example using a similar diamino backbone, but any emission of blue light with high color purity is not obtained.

DISCLOSURE OF THE INVENTION

The present invention has been created to solve these problems of prior art, and it is an object of the present invention to provide an organic light-emitting device that exhibits the hue of light emission having extremely high purity and has a light output having high luminance and long life with a high degree of efficiency and further to provide an organic light-emitting device that is easily produced and can be prepared at a relatively low cost.

According to an aspect of the present invention, there is provided an organic light-emitting device comprising a pair of electrodes consisting of an anode and a cathode and an organic compound-containing layer sandwiched between the pair of electrodes, wherein at least one layer of said organic compound-containing layers contains at least one compound selected from the group consisting of compounds represented by general formula [1]:

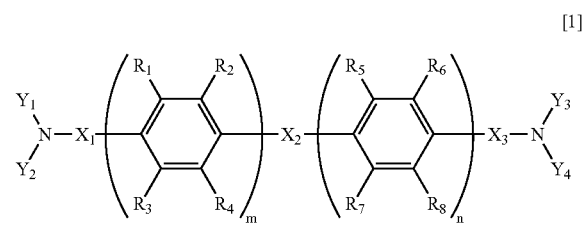

wherein
$Y_1$ and $Y_3$ can be bonded to $Y_2$ and $Y_4$ respectively to form a ring, and $X_1$ and $X_3$ can be bonded to $Y_1$ and/or $Y_2$ and $Y_3$ and/or $Y_4$ respectively to form a ring;

$X_1$, $X_2$ and $X_3$ are the same or different and are each independently a direct bond or a divalent group selected from the group consisting of alkylene, aralkylene, arylene, divalent-heterocyclic, alkenylene, imino, —SiH$_2$—, silylene, carbonyl, ether and thioether, each having no substituent or a substituent which can include a linking group consisting of arylene or divalent heterocyclic, each having no substituent or a substituent;

$Y_1$ to $Y_4$ are the same or different and are each independently a group selected from the group consisting of alkyl, aralkyl, aryl, heterocyclic, amino, silyl, alkylene, aralkylene, alkenylene, imino, —SiH$_2$—, silylene, carbonyl, ether and thioether, each having no substituent or a substituent which can include a linking group consisting of arylene or divalent heterocyclic, each having no substituent or a substitutent;

$R_1$ to $R_8$ are the same or different and are each independently hydrogen, halogen or a group selected from the group consisting of alkyl, aralkyl and aryl, each having no substituent or a substitutent; and m+n is an integer from 0 to 10, and at least one compound selected from the group consisting of compounds represented by general formulas [2] to [6]:

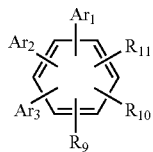

[2]

wherein $Ar_1$ to $Ar_3$ are the same or different and are each independently hydrogen or a group selected from the group consisting of aryl, heterocyclic, alkyl and aralkyl, each having no substituent or a substituent; and $R_9$ to $R_{11}$ are the same or different and are hydrogen, halogen, cyano, a substituted amino or a group selected from the group consisting of alkyl, aralkyl and amino, each having no substituent or a substituent, and;

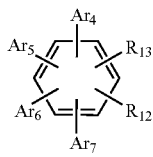

[3]

wherein $Ar_4$ to $Ar_7$ are the same or different and are each independently a group selected from the group consisting of aryl and heterocyclic, each having no substituent or a substituent; and $R_{12}$ and $R_{13}$ are the same or different and are hydrogen, halogen, cyano, a substituted amino or a group selected from the group consisting of alkyl and aralkyl, each having no substituent or a substituent;

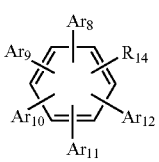

[4]

wherein $Ar_8$ to $Ar_{12}$ are the same or different and are each independently a group selected from the group consisting of aryl and heterocyclic, each having no substituent or a substituent; and $R_{14}$ is hydrogen, halogen, cyano, a substituted amino or a group selected from the group consisting of alkyl, aralkyl, aryl and heterocyclic, each having no substituent or a substituent;

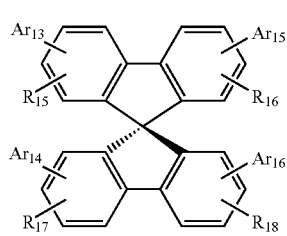

[5]

wherein $Ar_{13}$ to $Ar_{16}$ are the same or different and are each independently a group selected from the group consisting of aryl and heterocyclic, each having no substituent or a substituent, and any one to three of $Ar_{13}$ to $Ar_{16}$ can be hydrogen or a group selected from the group consisting of alkyl and aralkyl, each having no substituent or a substituent; and $R_{15}$ to $R_{18}$ are the same or different and are hydrogen, halogen, cyano, a substituted amino or a group selected from the group consisting of alkyl, aralkyl, aryl and heterocyclic, each having no substituent or a substituent;

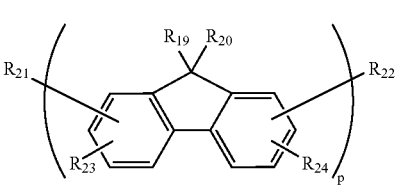

[6]

wherein $R_{19}$ and $R_{20}$ are the same or different and are hydrogen or a group selected from the group consisting of alkyl, aralkyl and aryl, each having no substituent or a substituent; any pair of $R_{19}$ combined to their respective fluorene structures are the same or different to each other; any pair of $R_{20}$ combined to their respective fluorene structures are the same or different to each other; $R_{21}$ to $R_{24}$ are hydrogen, halogen, cyano, a substituted silyl or a group selected from the group consisting of alkyl, aralkyl and alkoxy, each having no substituent or a substituent; and p is an integer from 2 to 10.

In the organic light-emitting device of the present invention, the layer that contains the compound represented by general formula [1] and the compound represented by any of general formulas [2] to [6] is preferably a light-emitting layer.

BEST MODE FOR CARRYING OUT THE INVENTION

Figure 1:
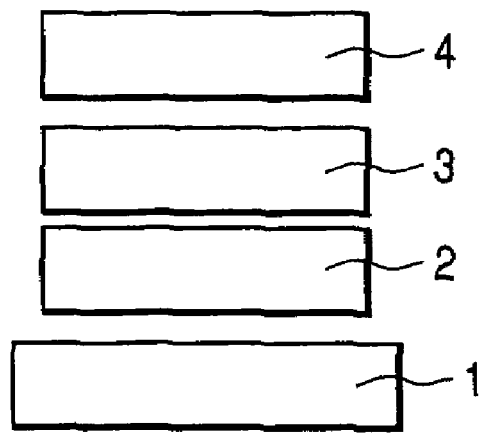
FIG. 1 is a sectional view illustrating one example of the organic light-emitting device according to the present invention.

The present invention will now be described in detail.

The compounds represented by the above general formulas [1] to [6] of the present invention will be first described.

The compounds represented by the general formulas [1] to [6] according to the present invention can be used mainly as a material for an organic light-emitting device. In the compound [1], an emission spectrum having a narrower half-value width, that is, the emission having better color purity can be obtained by introducing a relatively rigid structure such as a p-phenylene skeleton into a main molecular chain. Moreover, as the Stokes shift can be suppressed, it is also possible to suppress the transfer of light-emitting wavelength and bring the absorption to a longer wavelength side. When used as a dopant material, it is also possible to use a host material having an emission spectrum at a relatively longer wavelength side. Each of the compounds represented by the general formulas [1] to [6] can be used for both purposes, a dopant material and a host material, in a light-emitting layer, and a device having high color purity, high luminous efficiency and long life can be obtained. In particular, use of the compound represented by the general formula [1] as a dopant material in combination with any compound represented by the general formulas [2] to [6] that is a suitable host material that easily causes energy transfer allows the emission with high color purity to be maintained and a device having better efficiency to be obtained.

The concentration of the dopant relative to the host material is preferably 0.01 to 50% by weight, more preferably 0.5 to 10% by weight.

Specific examples of the substituents in the above general formulas [1] to [6] are shown below.

Examples of substituted or unsubstituted chain and cyclic alkyl groups include methyl, ethyl, n-propyl, n-butyl, n-hexyl, n-decyl, iso-propyl, iso-butyl, tert-butyl, tert-octyl, trifluoromethyl, cyclohexyl and cyclohexylmethyl, but not limited thereto.

Examples of substituted or unsubstituted aralkyl groups include benzyl and phenetyl, but not limited thereto.

Examples of substituted or unsubstituted aryl groups include phenyl, 4-methylphenyl, 4-methoxyphenyl, 4-ethylphenyl, 4-fluorophenyl, 3,5-dimethylphenyl, triphenylamino, biphenyl, terphenyl, naphthyl, anthracenyl, phenanthrenyl, pyrenyl, tetracenyl, pentacenyl, fluorenyl, triphenylenyl and perylenyl, but not limited thereto.

Examples of substituted or unsubstituted heterocyclic groups include pyrrolyl, pyridyl, bipyridyl, methylpyridyl, terpyrrolyl, thienyl, terthienyl, propylthienyl, furyl, quinolyl, carbazolyl, oxazolyl, oxadiazolyl, thiazolyl and thiadiazolyl, but not limited thereto.

Examples of substituted or unsubstituted alkylene groups include methylene, ethylene, propylene, iso-propylene, butylene, tert-butylene, hexylene, heptylene, cyclohexylene and cyclohexylmethylene, but not limited thereto.

Examples of substituted or unsubstituted aralkylene groups include benzylene, phenylethylene and phenethylene, but not limited thereto.

Examples of substituted or unsubstituted arylene groups include phenylene, biphenylene, 2,3,5,6-tetrafluorophenylene, 2,5-dimethylphenylene, naphthylene, anthracenylene, phenanthrenylene, tetracenylene, pentacenylene and perylenylene, but not limited thereto.

Examples of substituted or unsubstituted divalent heterocyclic groups include furanylene, pyrrolylene, pyridinylene, terpyridinylene, thiophenylene, terthiophenylene, oxazolylene, thiazolylene and carbazolylene, but not limited thereto.

Examples of substituted or unsubstituted alkenyl groups include vinyl, allyl (2-propenyl), 1-propenyl, iso-propenyl and 2-butenyl, but not limited thereto.

Examples of substituted or unsubstituted amino groups include amino, methylamino, ethylamino, dimethylamino, diethylamino, methylethylamino, benzylamino, methylbenzylamino, dibenzylamino, anilino, diphenylamino, phenyltolylamino, ditolylamino and dianisolylamino, but not limited thereto.

Examples of substituted or unsubstituted carbonyl groups include acetyl, propionyl, isobutylyl, methacryloyl, benzoyl, naphthoyl, anthrayl and toluoyl, but not limited thereto.

Examples of substituted or unsubstituted alkoxy groups include methoxy, ethoxy, propoxy, 2-ethyl-octyloxy, phenoxy, 4-butylphenoxy and benzyloxy, but not limited thereto.

Examples of substituted or unsubstituted sulfide groups include methylsulfide, ethylsulfide, phenylsulfide and 4-methylphenylsulfide, but not limited thereto.

Examples of substituents that may be owned by the above substituents include alkyl groups such as methyl, ethyl, n-propyl, iso-propyl, tert-butyl, octyl, benzyl, phenethyl and the like; alkoxy groups such as aralkyl, methoxy, ethoxy, propoxy, 2-ethyl-octyloxy, phenoxy, 4-butylphenoxy, benzyloxy groups and the like; aryl groups such as phenyl, 4-methylphenyl, 4-ethylphenyl, 3-chlorophenyl, 3,5 dimethylphenyl, triphenylamino, biphenyl, terphenyl, naphthyl, anthryl, phenanthryl and pyrenyl; heterocyclic groups such as pyridyl, bipyridyl, methylpyridyl, thienyl, terthienyl, propylthienyl, furyl, quinolyl, carbazolyl and N-ethylcarbazolyl; halogen, cyano and nitro, but not limited thereto.

The compounds shown by general formulas [1] to [6] are exemplified by compounds shown by the following formulae [1]-1 to [1]-91, [2]-1 to [2]-15, [3]-1 to [3]-14, [4]-1 to [4]-21, [5]-1 to [5]-14, and [6]-1 to [6]-7, respectively, but limited to them.

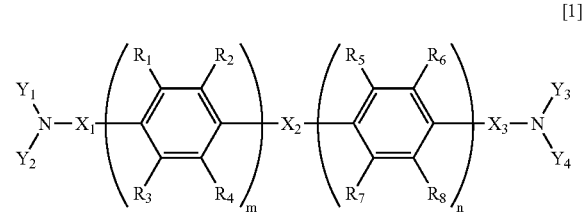

[1]

TABLE 1

| [1] | m, n | R1-R4 | R5-R8 | X1 | X2 | X3 | Y1 | Y2 | Y3 | Y4 |
|---|---|---|---|---|---|---|---|---|---|---|
| 1 | 0, 0 | — | — | Single bond | 9,10-anthracenyl | Single bond | Ph | Ph | Ph | Ph |
| 2 | 0, 0 | — | — | Single bond | 9,10-anthracenyl | Single bond | Ph | p-tolyl | Ph | p-tolyl |
| 3 | 0, 0 | — | — | Single bond | 9,10-anthracenyl | Single bond | Ph | 1-naphthyl | Ph | 1-naphthyl |
| 4 | 0, 0 | — | — | Single bond | 9,10-anthracenyl | Single bond | Ph | 9-anthracenyl | Ph | 9-anthracenyl |
| 5 | 0, 0 | — | — | Single bond | 9,10-anthracenyl | Single bond | Ph | 9-phenanthryl | Ph | 9-phenanthryl |

TABLE 1-continued

| m, [1] n | R1–R4 | R5–R8 | X1 | X2 | X3 | Y1 | Y2 | Y3 | Y4 |
|---|---|---|---|---|---|---|---|---|---|
| 6 0, 0 | — | — | Single bond | anthracene (9,10-substituted) | Single bond | Ph | pyrenyl | Ph | p-tolyl / p-tolyl |
| 7 0, 0 | — | — | Single bond | tetracene (substituted) | Single bond | Ph | pyrenyl | Ph | p-tolyl |
| 8 0, 0 | — | — | Single bond | tetracene (substituted) | Single bond | Ph | pyrenyl | Ph | pyrenyl |
| 9 0, 0 | — | — | Single bond | pentacene (substituted) | Single bond | Ph | pyrenyl | Ph | p-tolyl |
| 10 0, 0 | — | — | Single bond | pentacene (substituted) | Single bond | Ph | pyrenyl | Ph | pyrenyl |

TABLE 1-continued
| m, [1] n | R1–R4 | R5–R8 | X1 | X2 | X3 | Y1 | Y2 | Y3 | Y4 |
|---|---|---|---|---|---|---|---|---|---|
| 11  0, 0 | — | — | Single bond | 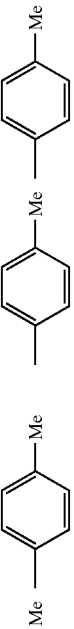 | Single bond | 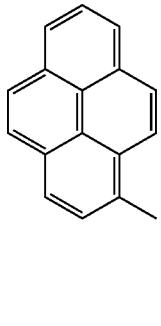 | 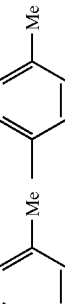 | 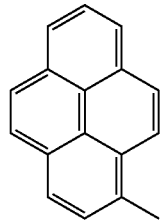 | 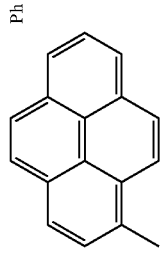 |
| 12  0, 0 | — | — | Single bond | 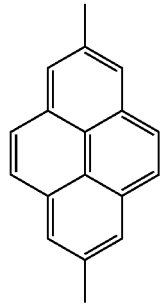 | Single bond | 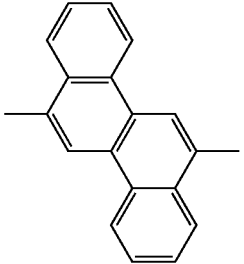 | 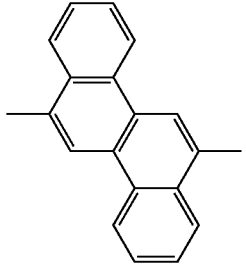 | Ph | 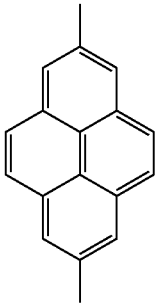 |
| 13  0, 0 | — | — | Single bond | 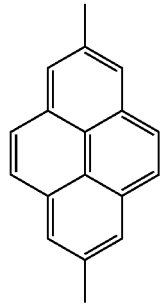 | Single bond | Ph | 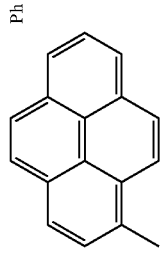 | 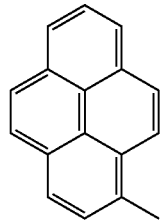 | 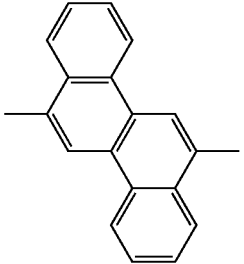 |
| 14  0, 0 | — | — | Single bond | 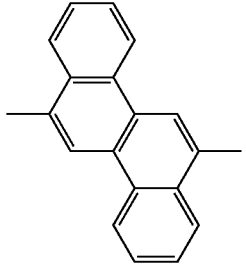 | Single bond | Ph | 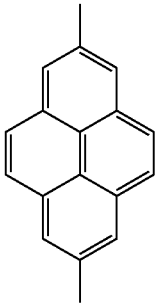 | Ph | 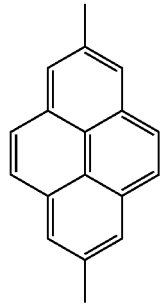 |

TABLE 1-continued

| m, [1] n | R1–R4 | R5–R8 | X1 | X2 | X3 | Y1 | Y2 | Y3 | Y4 |
|---|---|---|---|---|---|---|---|---|---|
| 15 0, 0 | — | — | Single bond | (perylene structure with methyl substituents) | Single bond | p-tolyl | p-tolyl | p-tolyl | p-tolyl |
| 16 0, 0 | — | — | Single bond | (perylene structure with methyl substituents) | Single bond | p-tolyl | p-tolyl | p-tolyl | p-tolyl |
| 17 0, 0 | — | — | (9,10-dimethylanthracene) | (9,10-dimethylanthracene) | Single bond | p-tolyl | p-tolyl | p-tolyl | p-tolyl |

TABLE 2
| [1] | m, n | R1–R4 | R5–R8 | X1 | X2 | X3 | Y1 | Y2 | Y3 | Y4 |
|---|---|---|---|---|---|---|---|---|---|---|
| 18 | 0, 0 | — | — |  |  |  |  |  |  |  |
| 19 | 2, 0 | H | — | Single bond | Single bond | Single bond |  |  |  |  |
| 20 | 2, 0 | H | — | Single bond | Single bond | Single bond |  |  |  |  |
| 21 | 2, 0 | H | — | Single bond | Single bond | Single bond | Ph |  | Ph |  |
| 22 | 2, 0 | H | — | Single bond | Single bond | Single bond | Ph |  | Ph |  |
| 23 | 2, 0 | H | — | Single bond | Single bond | Single bond | Ph |  | Ph |  |
| 24 | 2, 0 | H | — | Single bond | Single bond | Single bond | Ph |  | Ph |  |

TABLE 2-continued

| m, [1] n | R1–R4 | R5–R8 | X1 | X2 | X3 | Y1 | Y2 | Y3 | Y4 |
|---|---|---|---|---|---|---|---|---|---|
| 25 2, 0 | F | — | Single bond | Single bond | Single bond | p-tolyl | | | p-tolyl |
| 26 2, 0 | F | — | Single bond | Single bond | Single bond | Ph | pyrenyl | Ph | pyrenyl |
| 27 3, 0 | H | — | Single bond | Single bond | Single bond | p-tolyl | | p-tolyl | p-tolyl |
| 28 3, 0 | H | — | Single bond | Single bond | Single bond | Ph | naphthyl | Ph | naphthyl |
| 29 3, 0 | H | — | Single bond | Single bond | Single bond | Ph | anthracenyl | Ph | anthracenyl |
| 30 3, 0 | H | — | Single bond | Single bond | Single bond | Ph | phenanthrenyl | Ph | phenanthrenyl |
| 31 3, 0 | H | — | Single bond | Single bond | Single bond | Ph | pyrenyl | Ph | pyrenyl |

TABLE 2-continued
| m, [1] n | R1–R4 | R5–R8 | X1 | X2 | X3 | Y1 | Y2 | Y3 | Y4 |
|---|---|---|---|---|---|---|---|---|---|
| 32 3, 0 | F | — | Single bond | Single bond | Single bond | 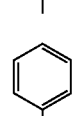 | 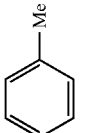 |  | 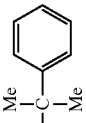 |
| 33 3, 0 | F | — | Single bond | Single bond | Single bond | Ph |  | Ph | 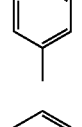 |
| 34 4, 0 | H | — | Single bond | Single bond | Single bond |  | 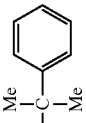 | 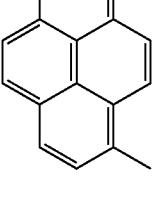 | 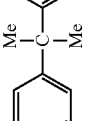 |
| 35 4, 0 | H | — | Single bond | Single bond | Single bond | 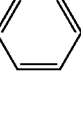 | 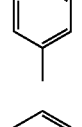 | 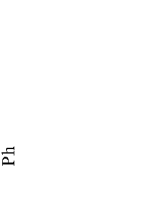 | 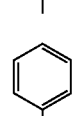 |
| 36 4, 0 | H | — | Single bond | Single bond | Single bond | Ph | 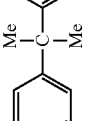 | Ph | 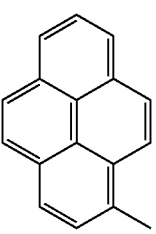 |

TABLE 3

| [1] | m, n | R1–R4 | R5–R8 | X1 | X2 | X3 | Y1 | Y2 | Y3 | Y4 |
|---|---|---|---|---|---|---|---|---|---|---|
| 37 | 4, 0 | H | — | Single bond | Single bond | Single bond | Ph | 2-naphthyl | Ph | 2-naphthyl |
| 38 | 4, 0 | H | — | Single bond | Single bond | Single bond | Ph | 9,9-dimethylfluorenyl | Ph | 9,9-dimethylfluorenyl |
| 39 | 4, 0 | H | — | Single bond | Single bond | Single bond | Ph | biphenyl | Ph | biphenyl |
| 40 | 4, 0 | H | — | Single bond | Single bond | Single bond | Ph | biphenyl | Ph | biphenyl |
| 41 | 4, 0 | H | — | Single bond | Single bond | Single bond | biphenyl | anthracenyl | biphenyl | anthracenyl |
| 42 | 4, 0 | H | — | Single bond | Single bond | Single bond | Ph | phenanthrenyl | Ph | phenanthrenyl |
| 43 | 4, 0 | H | — | Single bond | Single bond | Single bond | Ph | pyrenyl | Ph | pyrenyl |

TABLE 3-continued
| [1] | m, n | R1–R4 | R5–R8 | X1 | X2 | X3 | Y1 | Y2 | Y3 | Y4 |
|---|---|---|---|---|---|---|---|---|---|---|
| 44 | 4, 0 | F | — | Single bond | Single bond | Single bond |  |  |  |  |
| 45 | 4, 0 | F | — | Single bond | Single bond | Single bond | Ph |  | |  |
| 46 | 5, 0 | H | — | Single bond | Single bond | Single bond |  |  |  |  |
| 47 | 5, 0 | H | — | Single bond | Single bond | Single bond | Ph |  | |  |
| 48 | 5, 0 | H | — | Single bond | Single bond | Single bond | Ph |  | |  |
| 49 | 5 | H | — | Single bond | Single bond | Single bond | Ph |  | Ph |  |
| 50 | 5 | H | — | Single bond | Single bond | Single bond | Ph | | Ph | |
| 51 | 5, 0 | H | — | Single bond | Single bond | Single bond | |  | | |

TABLE 3-continued
| [1] | m, n | R1–R4 | R5–R8 | X1 | X2 | X3 | Y1 | Y2 | Y3 | Y4 |
|---|---|---|---|---|---|---|---|---|---|---|
| 52 | 5, 0 | H | — | Single bond | Single bond | Single bond | Ph | 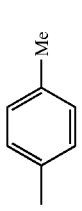 | Ph | 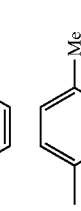 |
| 53 | 1, 1 | H | F | Single bond | Single bond | Single bond | 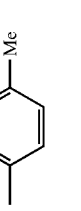 |  | 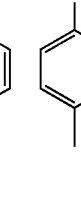 | 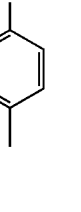 |
| 54 | 2, 1 | H | F | Single bond | Single bond | Single bond |  |  |  |  |
| 55 | 2, 2 | H | F | Single bond | Single bond | Single bond |  |  |  | 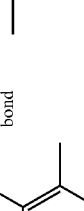 |
| 56 | 1, 1 | H | H | Single bond |  | Single bond |  |  |  |  |

TABLE 4
| [1] | m, n | R1–R4 | R5–R8 | X1 | X2 | X3 | Y1 | Y2 | Y3 | Y4 |
|---|---|---|---|---|---|---|---|---|---|---|
| 57 | 1, 1 | H | H | Single bond | 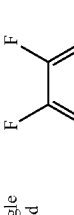 | Single bond | 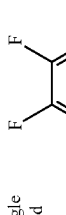 | 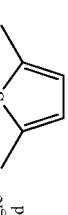 | 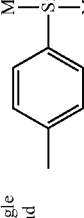 | 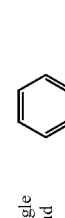 |
| 58 | 1, 1 | H | H | Single bond | 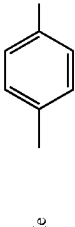 | Ph | Ph | 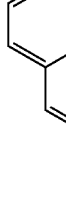 | | 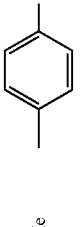 |
| 59 | 1, 1 | H | H | Single bond | 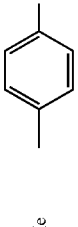 | Single bond | 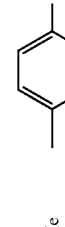 | 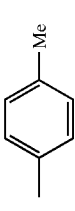 | 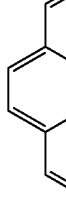 | 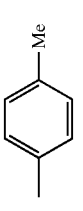 |
| 60 | 1, 1 | H | H | Single bond | 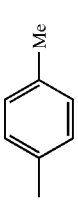 | Single bond | 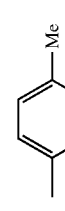 |  | 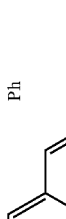 |  |
| 61 | 1, 1 | H | H | Single bond |  | Single bond |  | 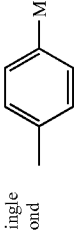 |  | 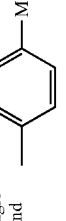 |
| 62 | 1, 1 | H | H | Single bond | 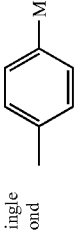 | Single bond | 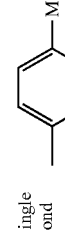 | 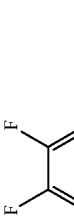 |  | 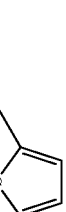 |
| 63 | 1, 1 | H | H | Single bond | 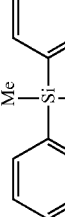 | Single bond |  | 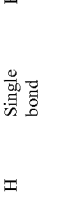 | 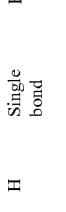 | 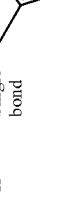 |

TABLE 4-continued
| m, [1] n | R1–R4 | R5–R8 | X1 | X2 | X3 | Y1 | Y2 | Y3 | Y4 |
|---|---|---|---|---|---|---|---|---|---|
| 64 1, 1 | H | H | Single bond |  | Single bond | 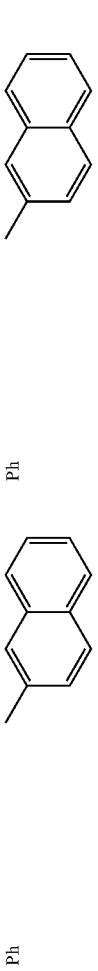 | 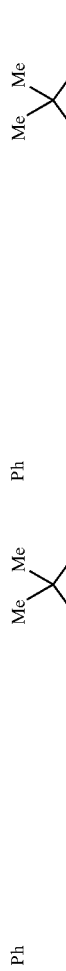 | 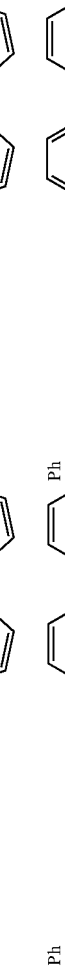 |  |
| 65 1, 1 | H | H | Single bond | 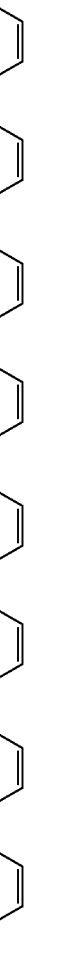 | Single bond | Ph |  | Ph | 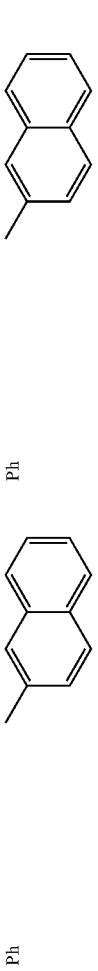 |
| 66 1, 1 | H | H | Single bond | 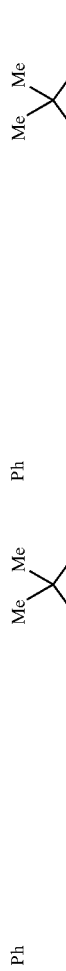 | Single bond | Ph | 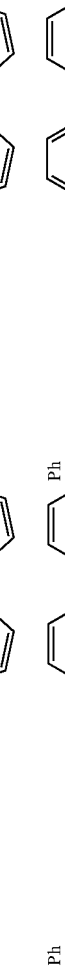 | Ph |  |
| 67 1, 1 | H | H | Single bond | 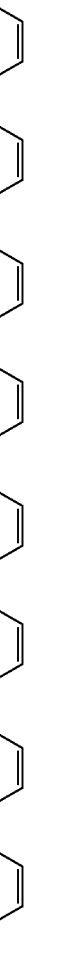 | Single bond | Ph |  | Ph | 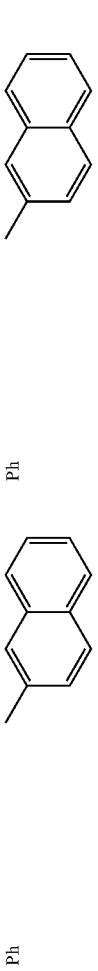 |
| 68 1, 1 | H | H | Single bond | 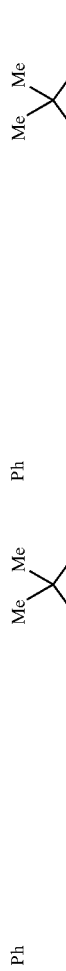 | Single bond | 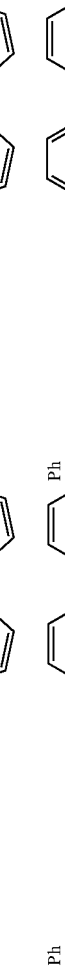 |  | 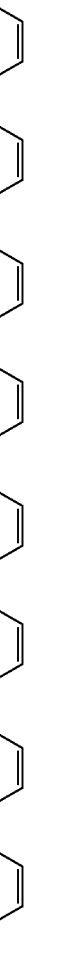 |  |
| 69 1, 1 | H | H | Single bond | 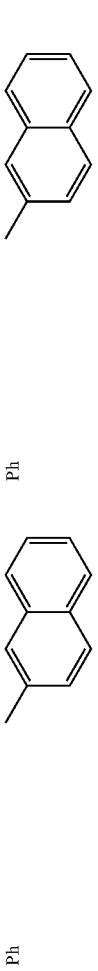 | Single bond | 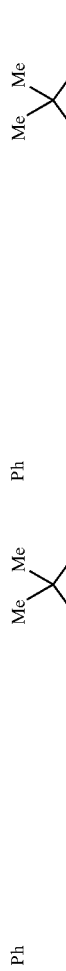 | 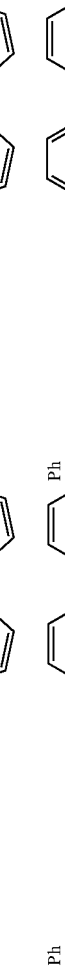 |  | 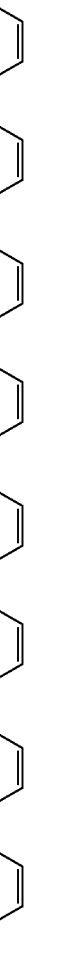 |

TABLE 4-continued
| m, [1] n | R1–R4 | R5–R8 | X1 | X2 | X3 | Y1 | Y2 | Y3 | Y4 |
|---|---|---|---|---|---|---|---|---|---|
| 70 1, 1 | H | H | Single bond |  | Single bond | 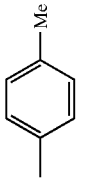 | 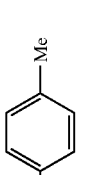 |  | 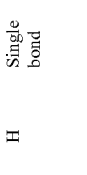 |
| 71 1, 1 | H | H | Single bond | 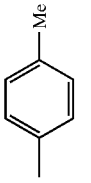 | Single bond | 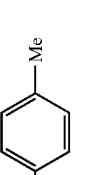 | 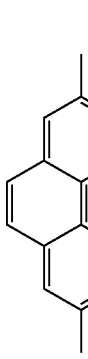 | 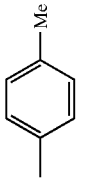 | 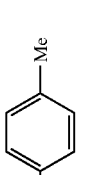 |
| 72 1, 1 | H | H | Single bond |  | Single bond | 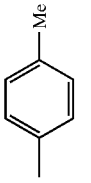 | 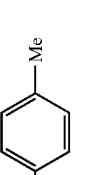 | 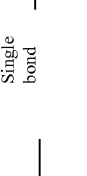 | 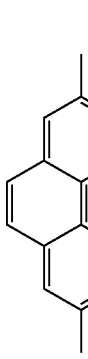 |

TABLE 5
| m,[1] n | R1–R4 | R5–R8 | X1 | X2 | X3 | Y1 | Y2 | Y3 | Y4 |
|---|---|---|---|---|---|---|---|---|---|
| 73 1,1 | H | | Single bond |  | Single bond | 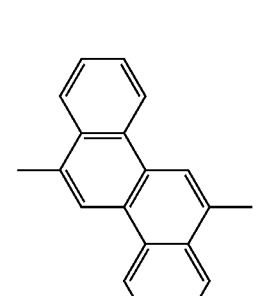 | 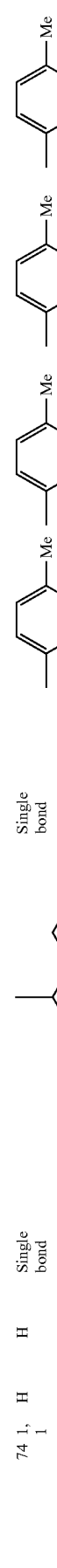 | 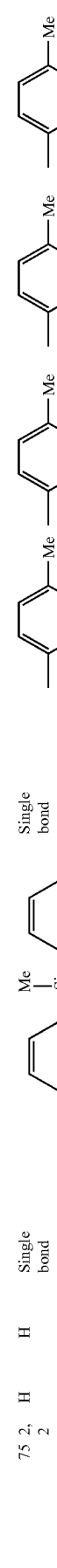 | 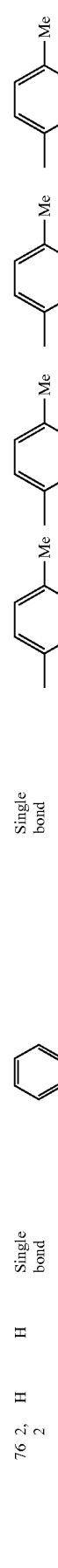 |
| 74 1,1 | H | | Single bond | 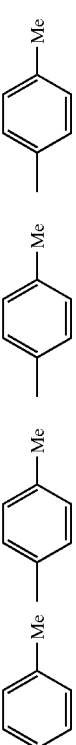 | Single bond | 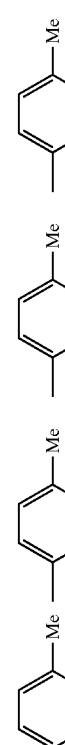 | 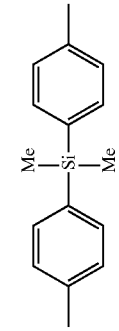 |  | 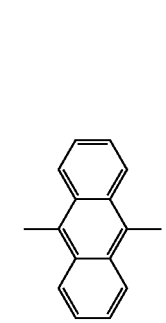 |
| 75 2,2 | H | | Single bond | 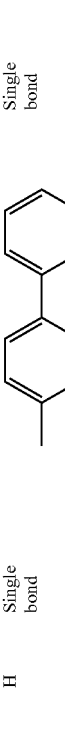 | Single bond |  | 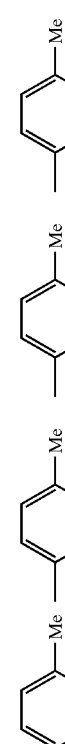 | 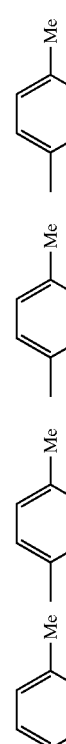 | 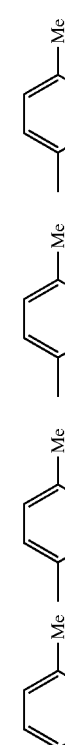 |
| 76 2,2 | H | | Single bond | 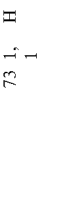 | Single bond | 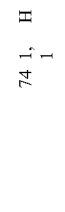 | 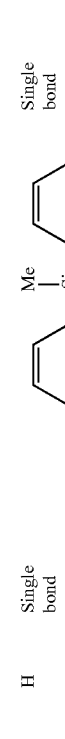 | 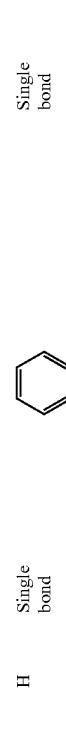 | 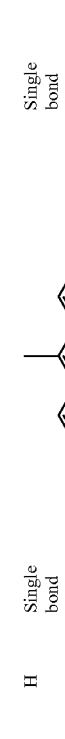 |
| 77 2,2 | H | | Single bond | 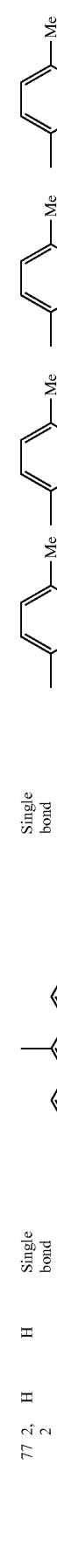 | Single bond |  |  |  | |

TABLE 5-continued
| m, [1] n | R1–R4 | R5–R8 | X1 | X2 | X3 | Y1 | Y2 | Y3 | Y4 |
|---|---|---|---|---|---|---|---|---|---|
| 78 2, 2 | H | H | Single bond | 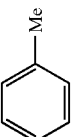 | Single bond | 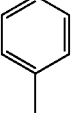 | 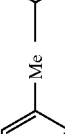 | 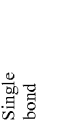 |  |
| 79 1, 1 | H | F | Single bond | 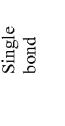 | Single bond |  | 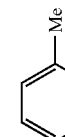 | 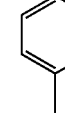 | 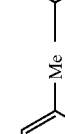 |
| 80 1, 1 | H | F | Single bond | 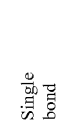 | Single bond |  | 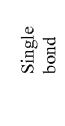 |  | 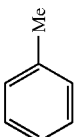 |
| 81 1, 1 | H | F | Single bond | 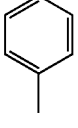 | Single bond | 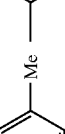 | 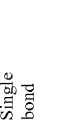 | 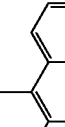 | 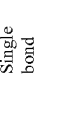 |
| 82 1, 1 | H | F |  | Single bond | 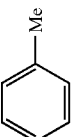 | 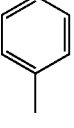 |  | 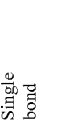 |  |
| 83 2, 1 | H | F | 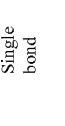 | Single bond |  | 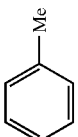 | 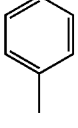 | 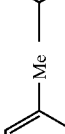 | 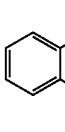 |

TABLE 5-continued
| m, [1] n | R1–R4 | R5–R8 | X1 | X2 | X3 | Y1 | Y2 | Y3 | Y4 |
|---|---|---|---|---|---|---|---|---|---|
| 84 2, 2 | H | F | 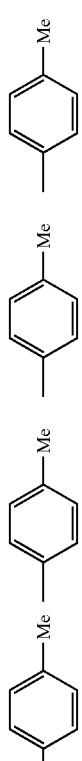 | Single bond | 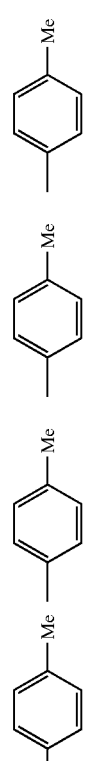 | 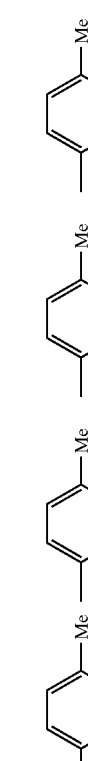 |  |  |  |
| 85 1, 1 | H | H |  | 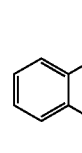 | 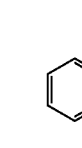 |  |  |  | 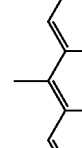 |
| 86 2, 2 | H | H |  | 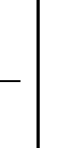 |  |  | | | |

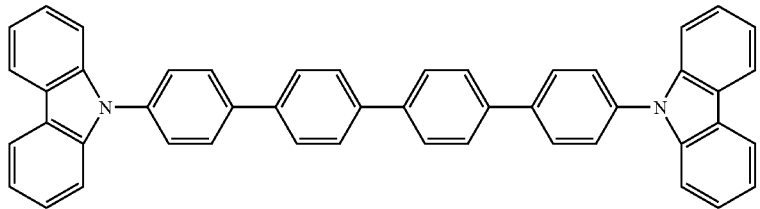
[1]-87
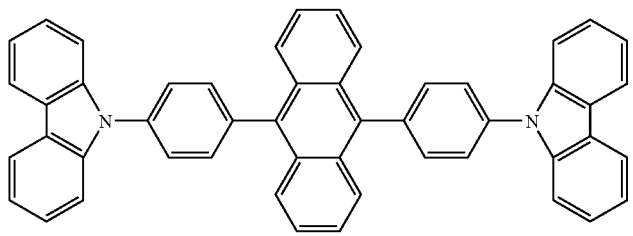
[1]-88
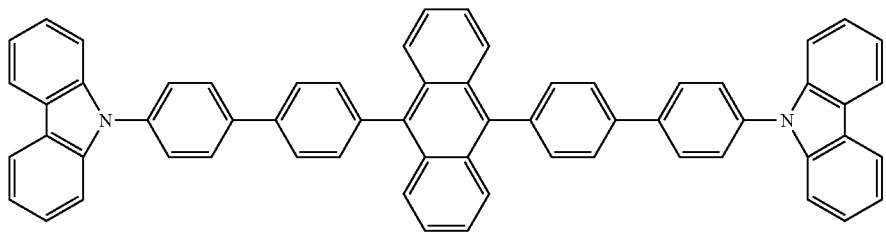
[1]-89
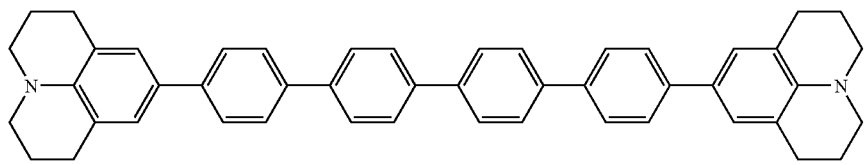
[1]-90
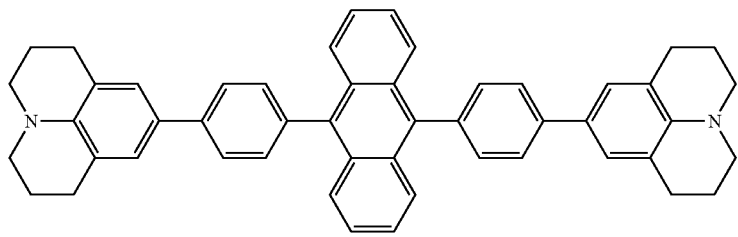
[1]-91

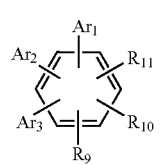
[2]
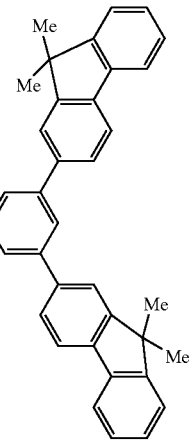
[2]-1
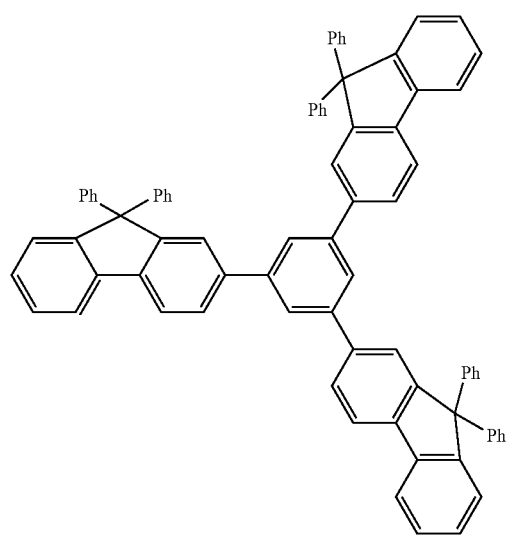
[2]-2
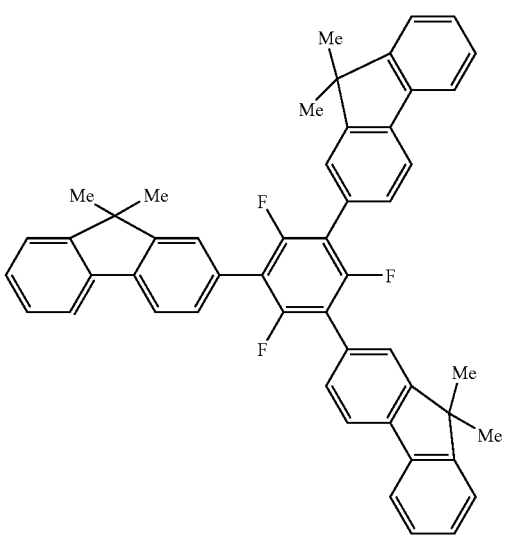
[2]-3
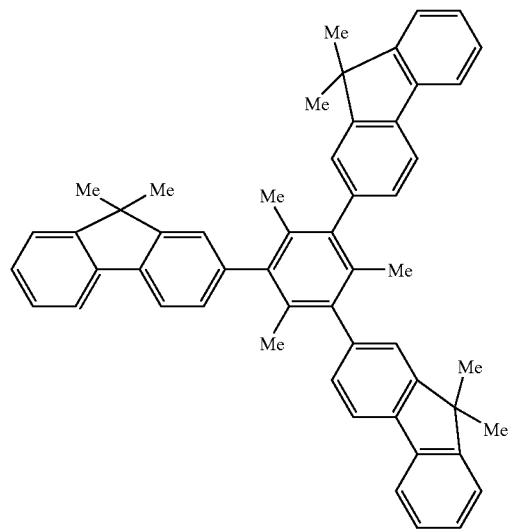
[2]-4

-continued
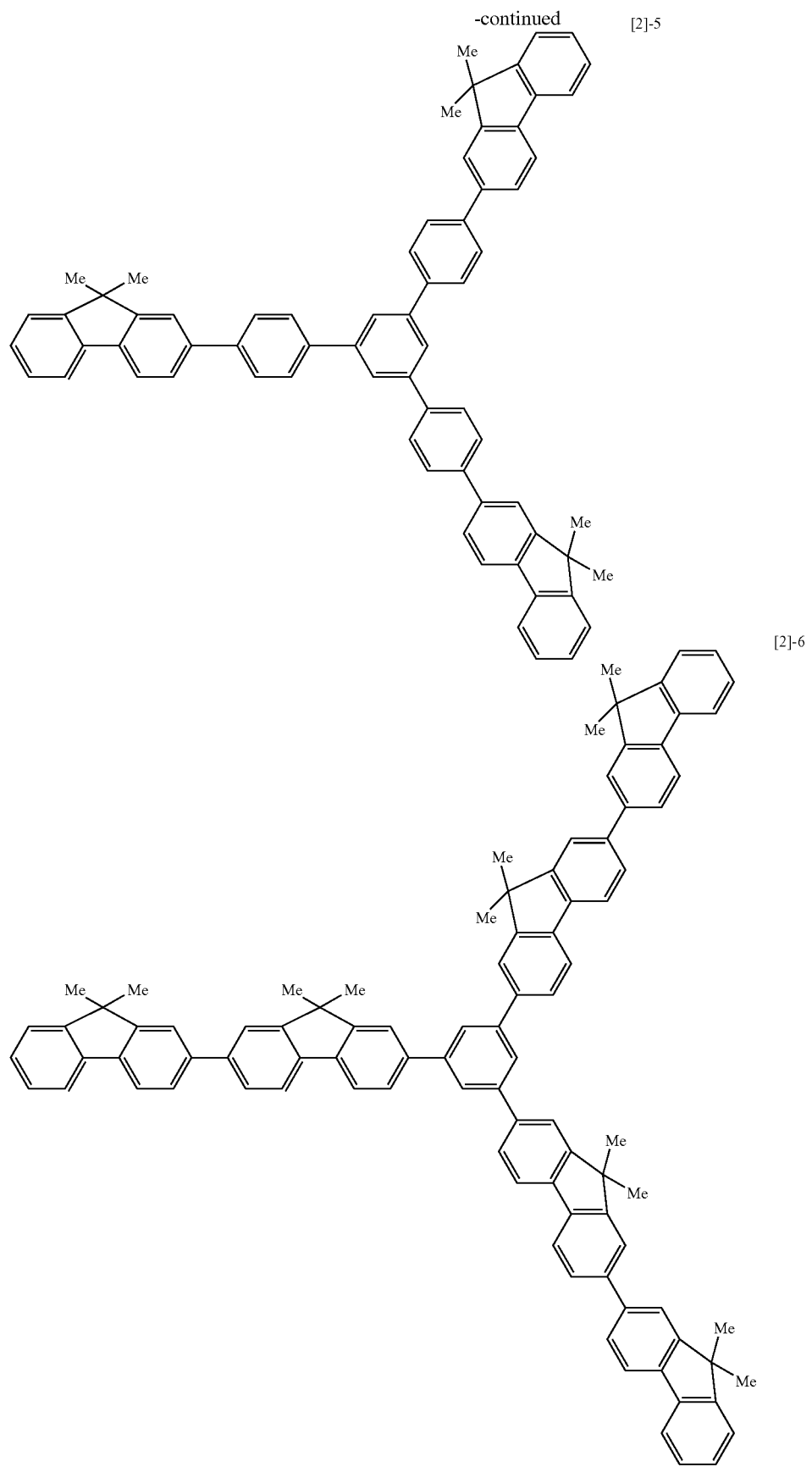

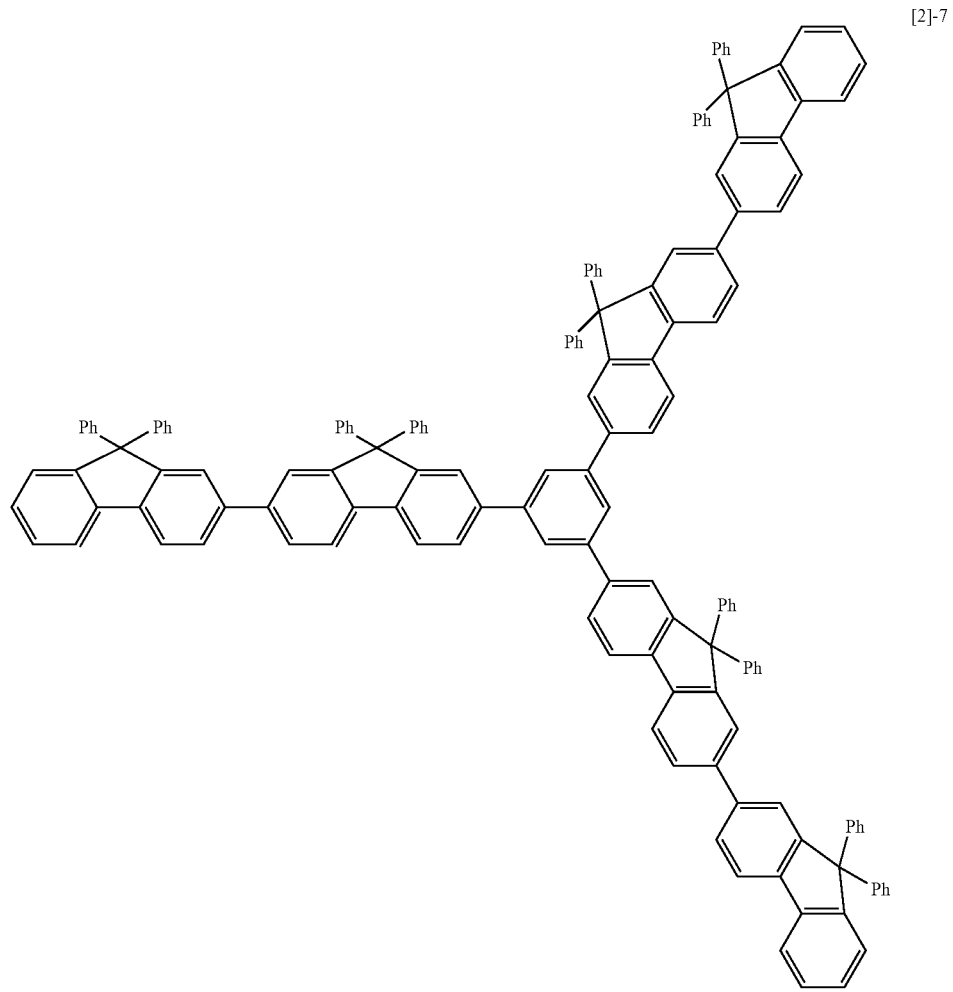
[2]-7
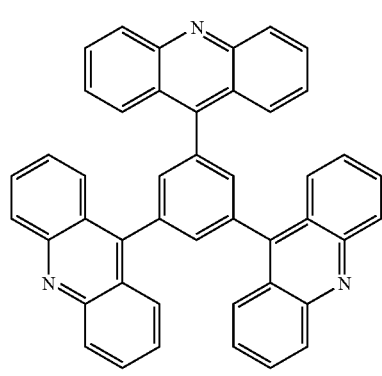
[2]-8
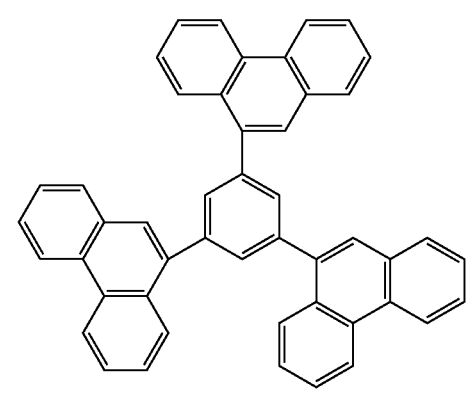
[2]-9

-continued
[2]-10
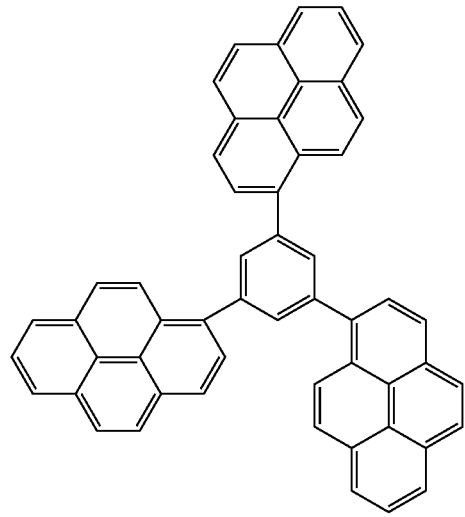
[2]-11
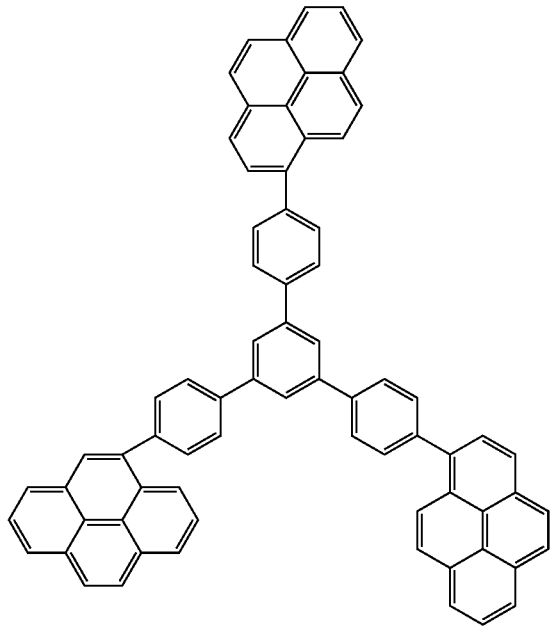
[2]-12
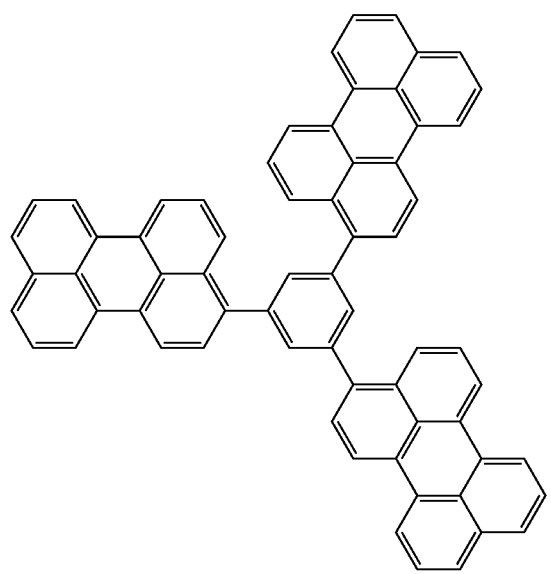
[2]-13
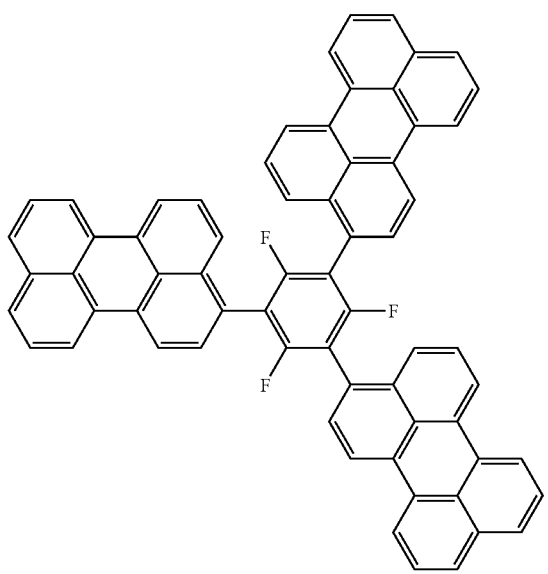

-continued
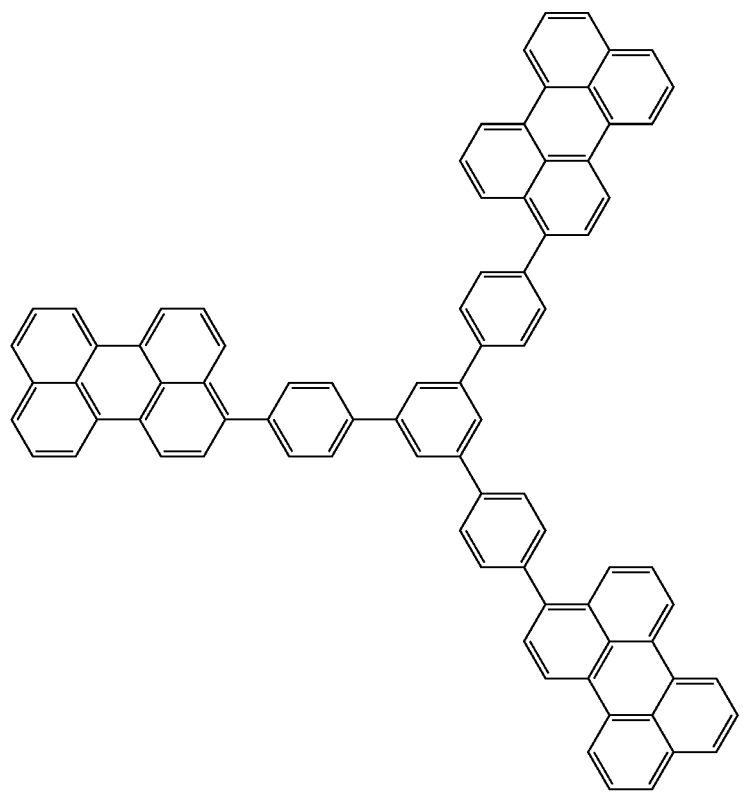
[2]-14
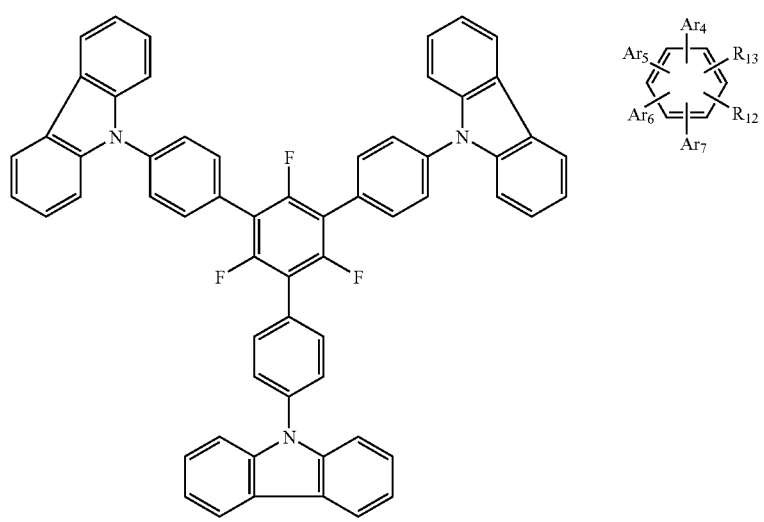
[2]-15
[3]

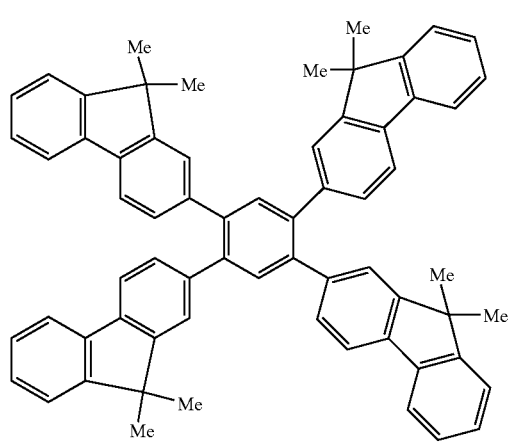
[3]-1
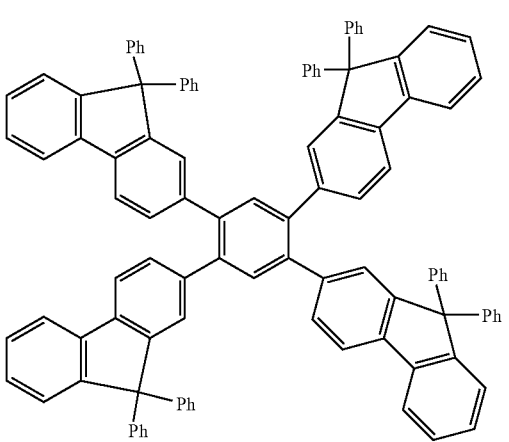
[3]-2
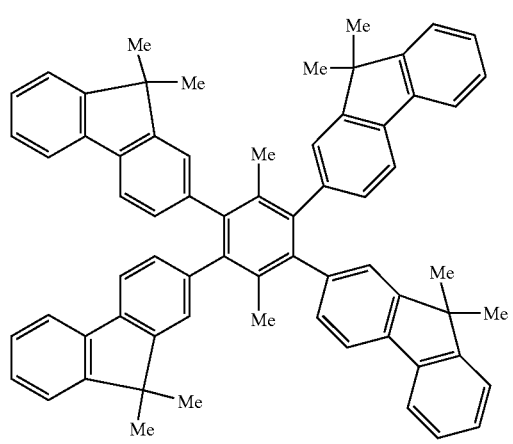
[3]-3
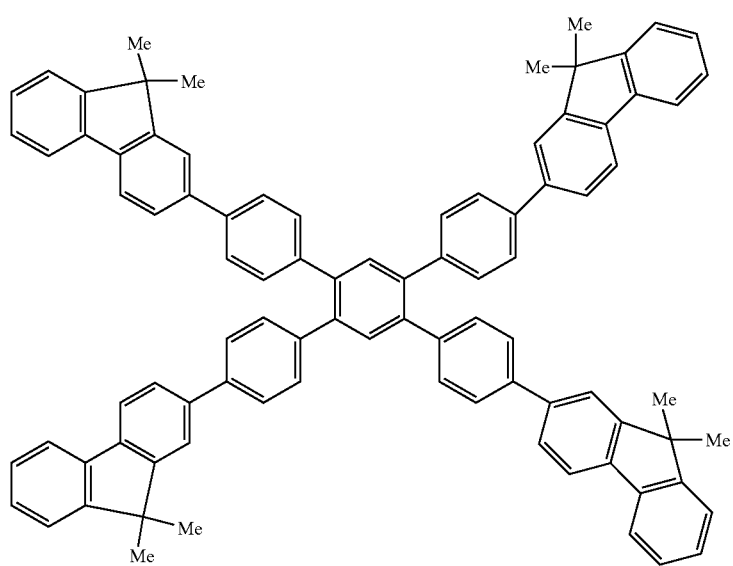
[3]-4

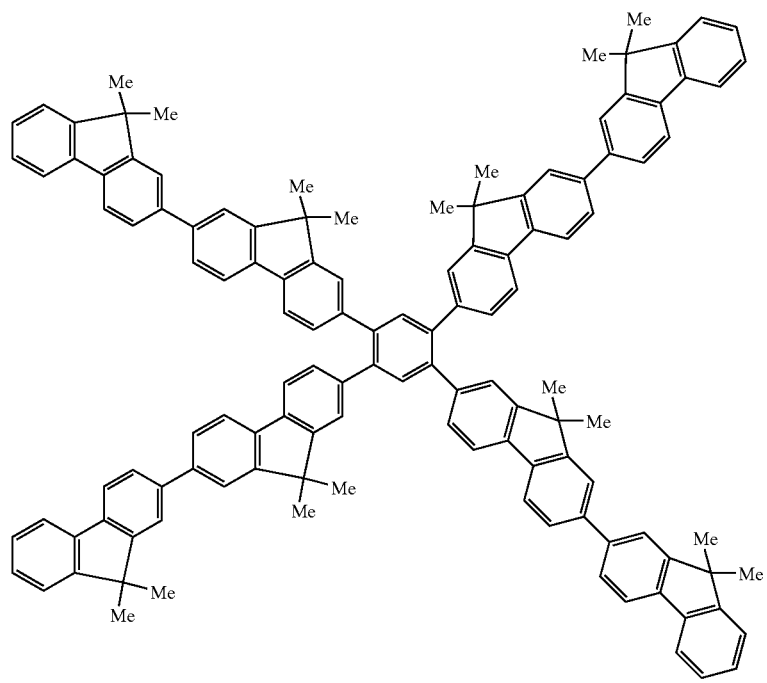
[3]-5
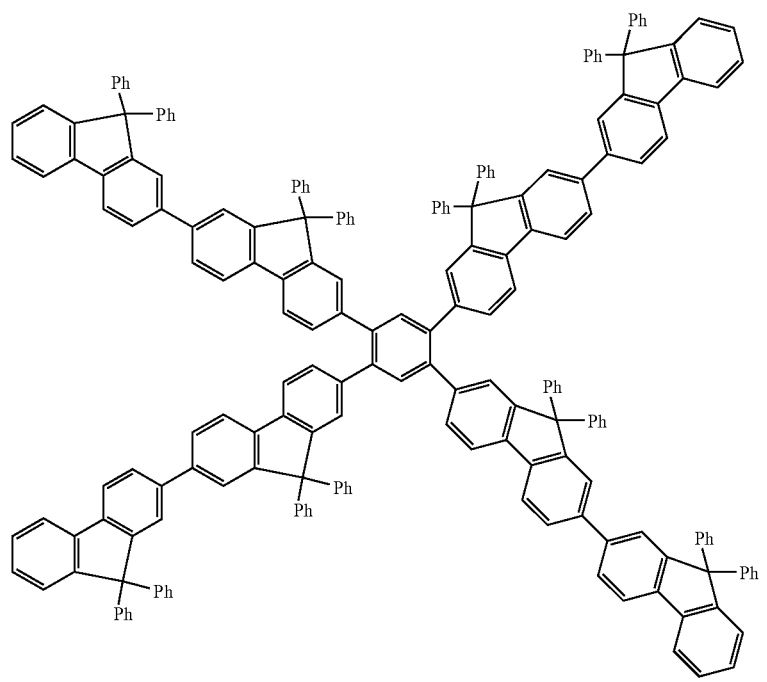
[3]-6

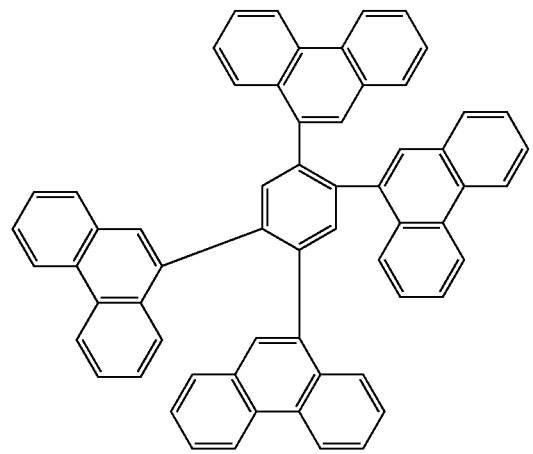 [3]-7
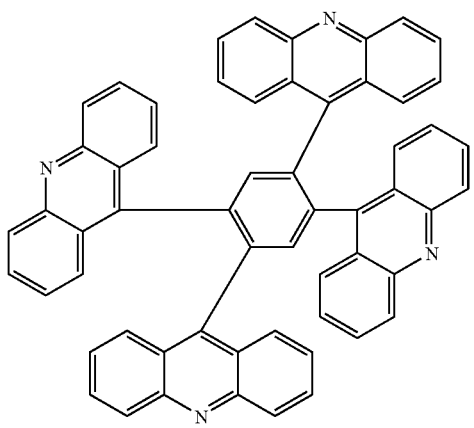 [3]-8
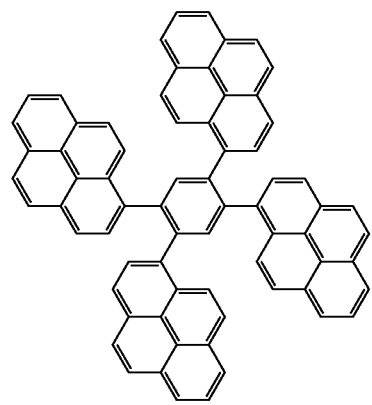 [3]-9
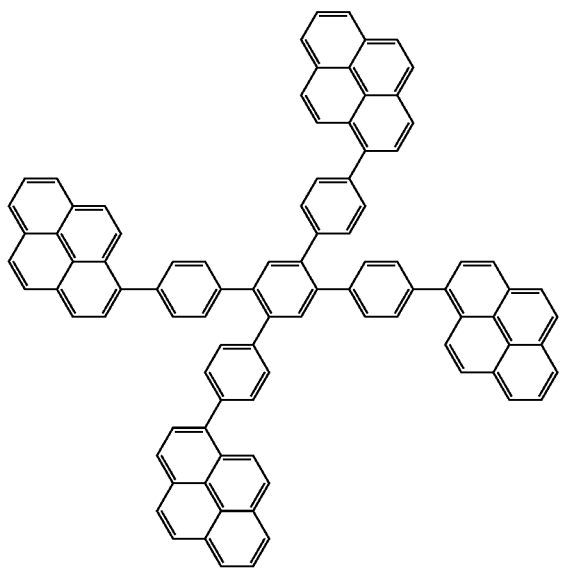 [3]-10

-continued
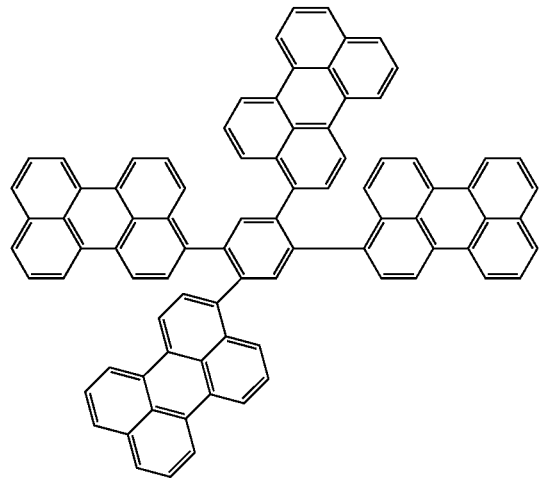
[3]-11
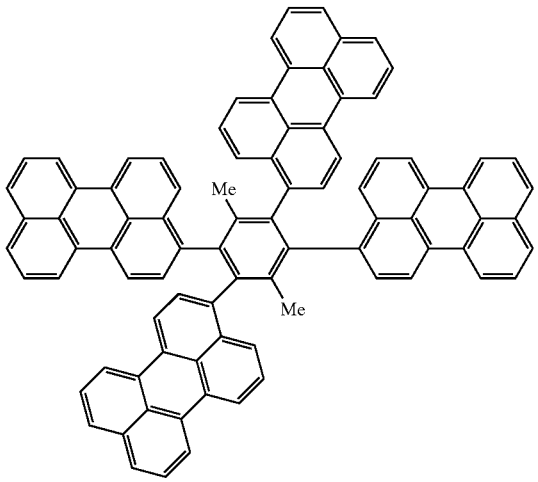
[3]-12
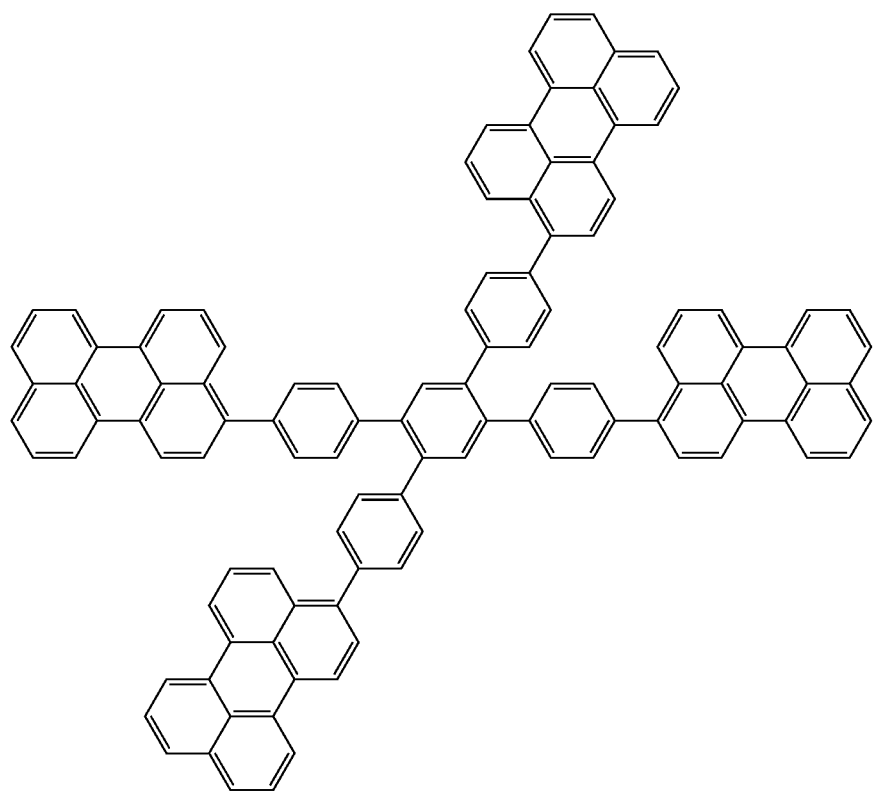
[3]-13

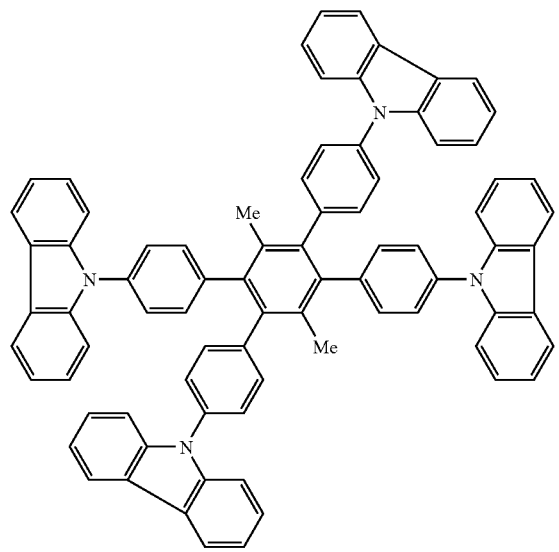
[3]-14
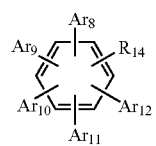
[4]
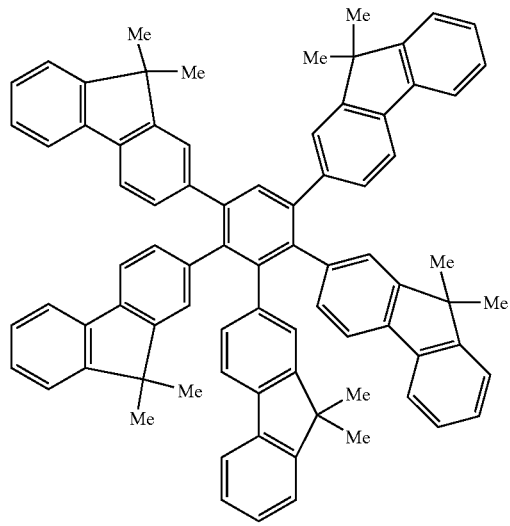
[4]-1
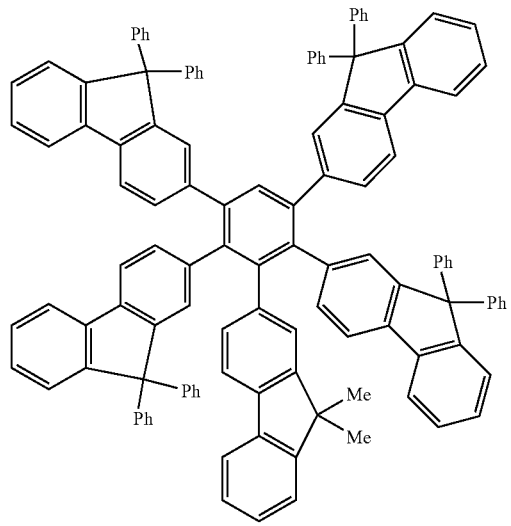
[4]-2

-continued
[4]-3
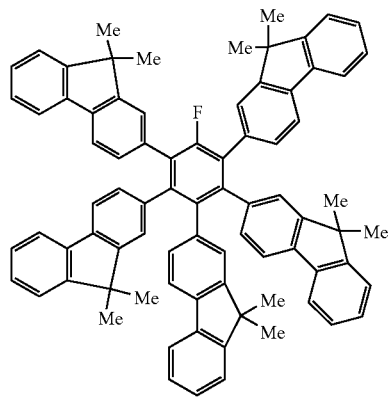
[4]-4
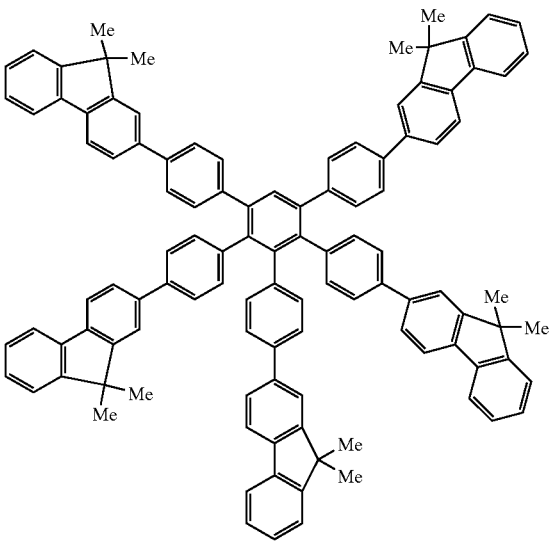
[4]-5
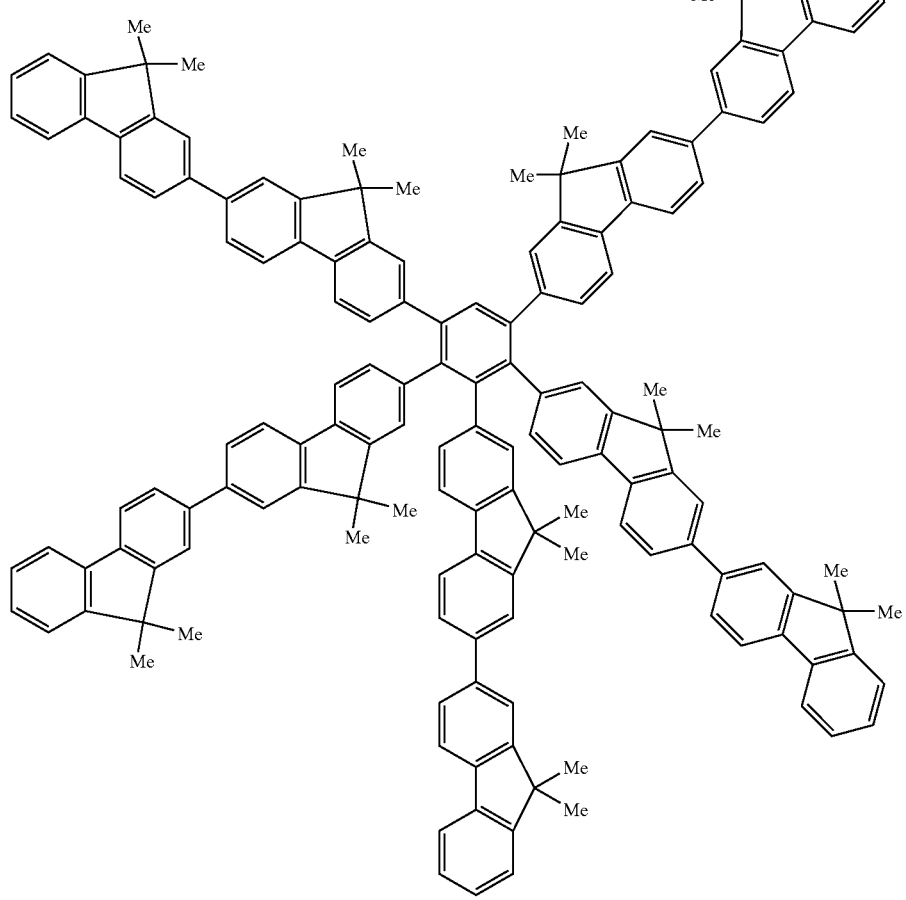

[4]-6
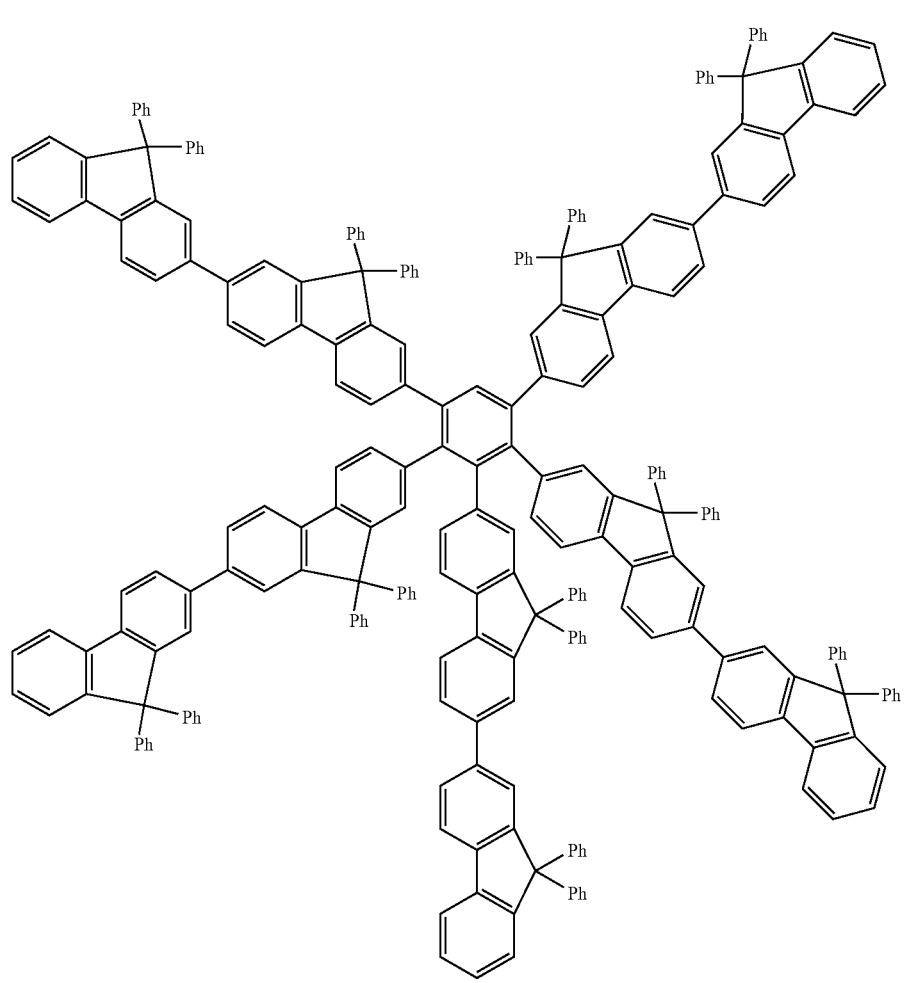
[4]-7
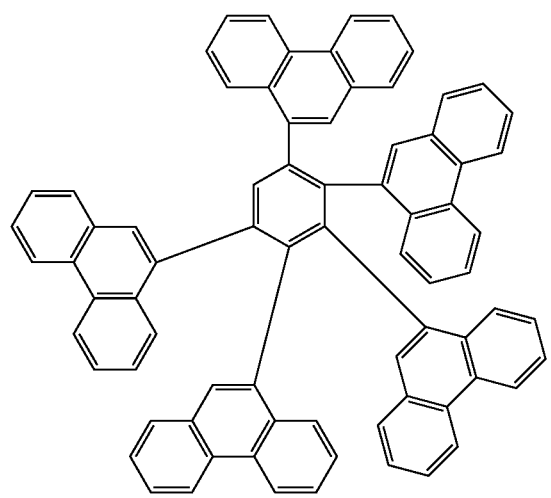
[4]-8
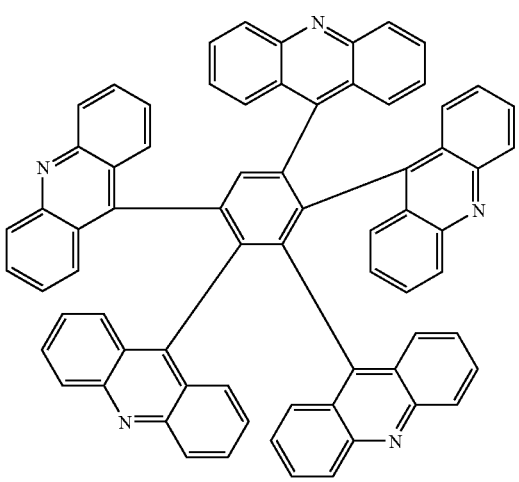

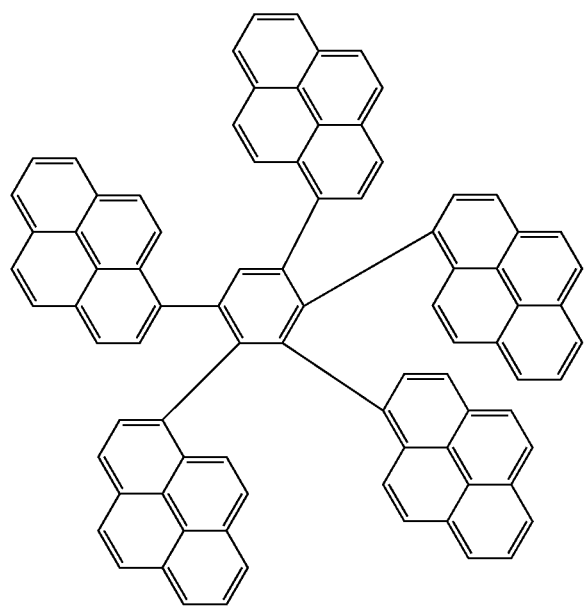
[4]-9
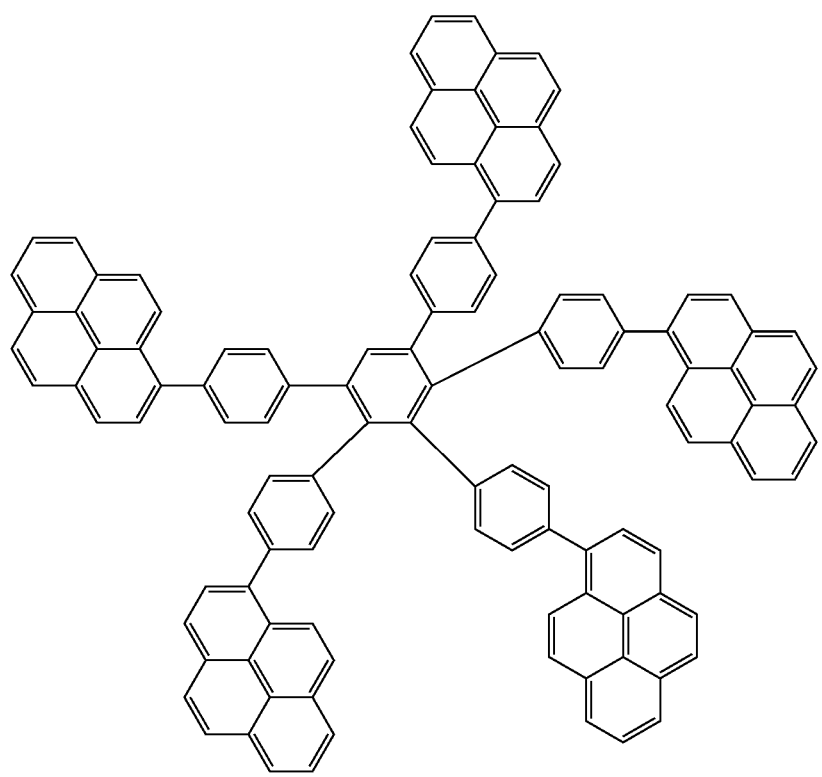
[4]-10

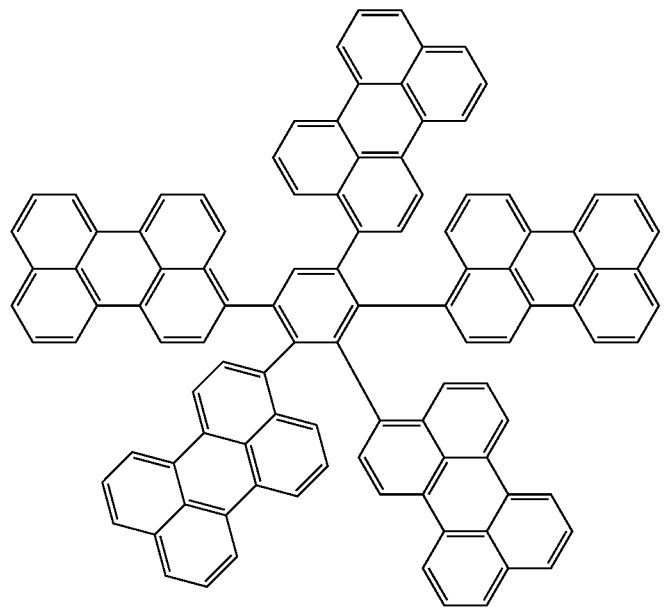
[4]-11
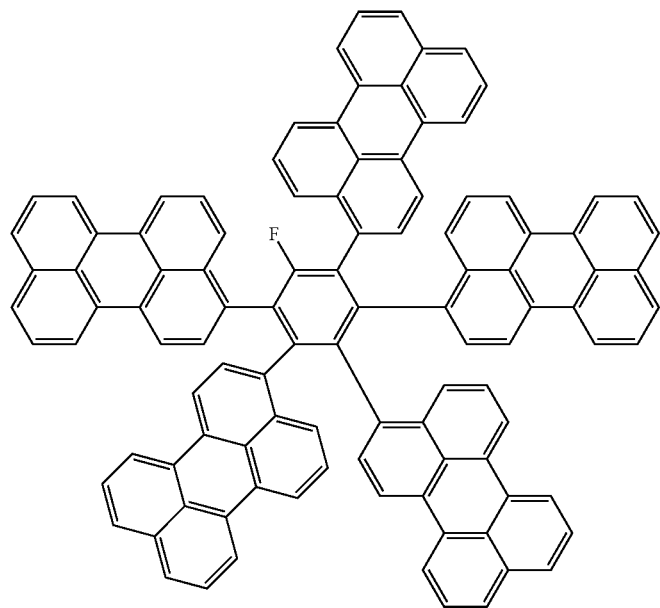
[4]-12

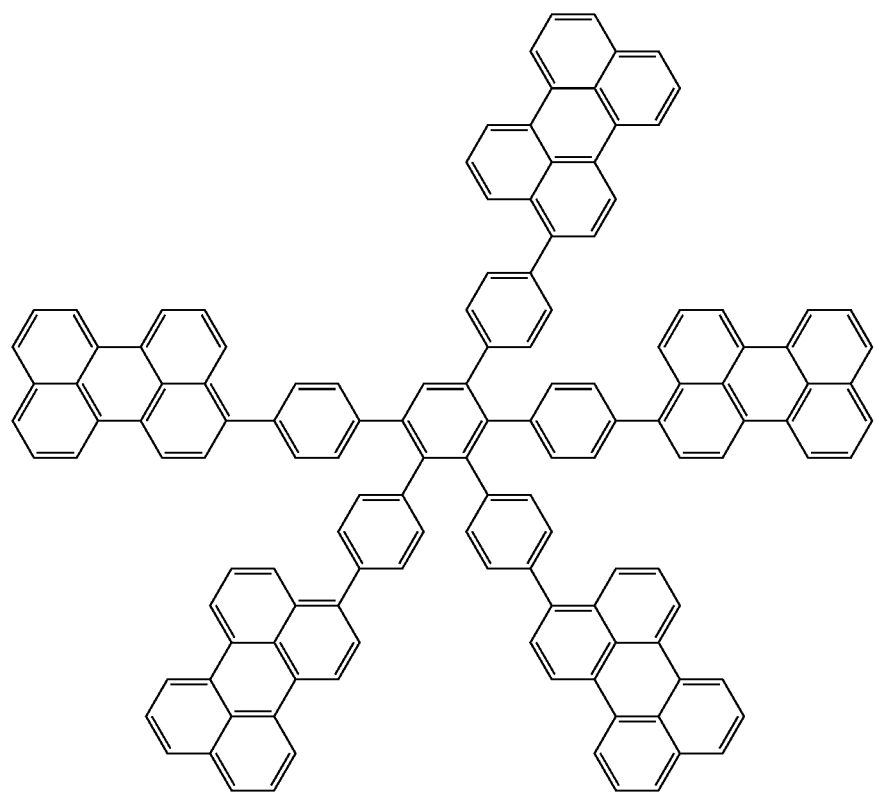
[4]-13
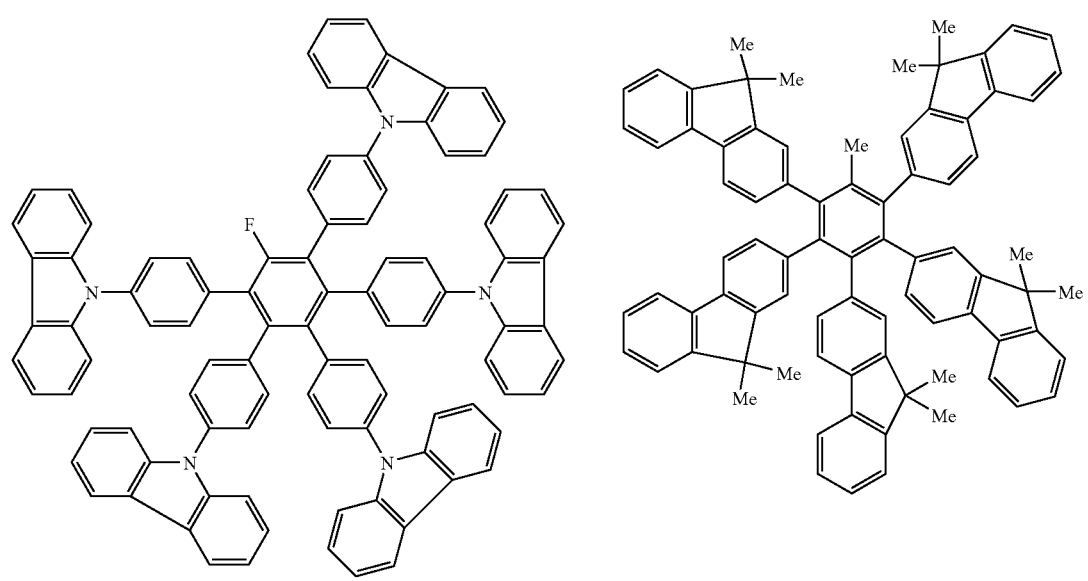
[4]-14
[4]-15

-continued
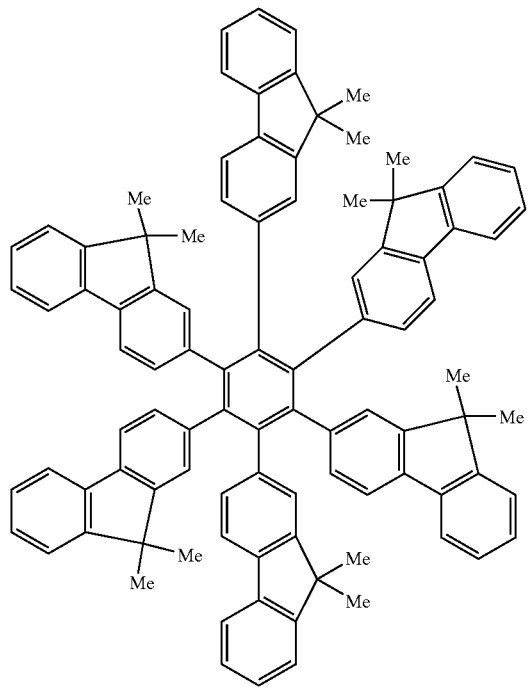
[4]-16
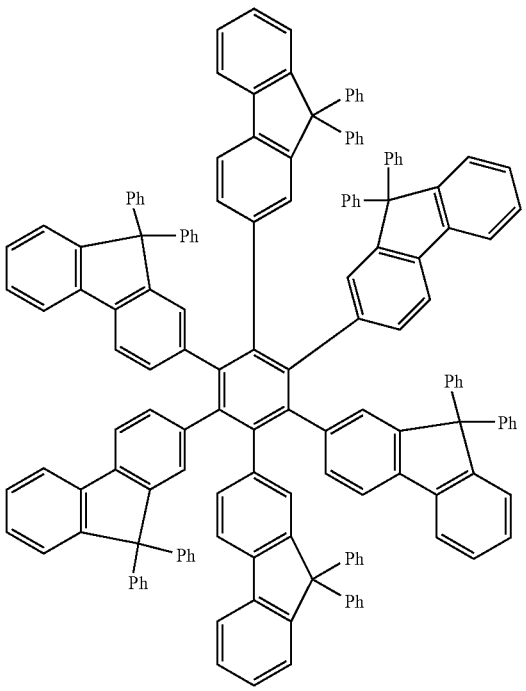
[4]-17
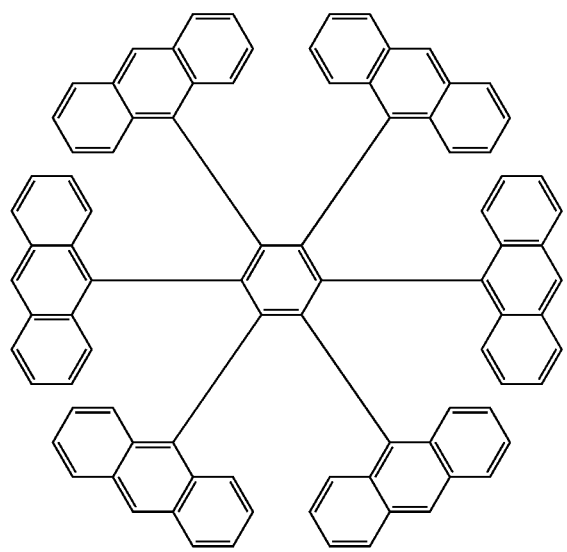
[4]-18
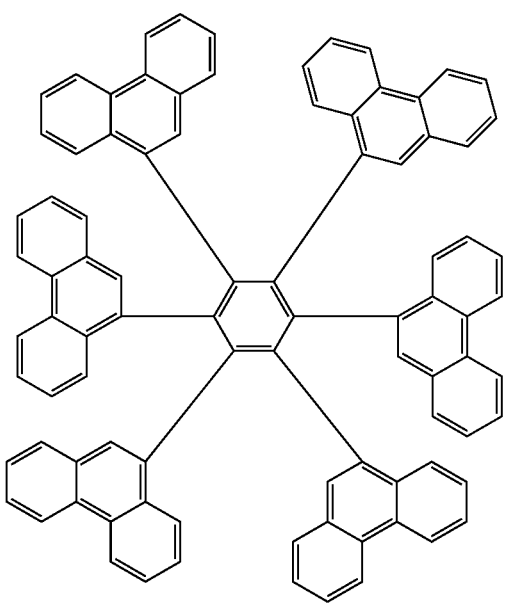
[4]-19

-continued
[4]-20
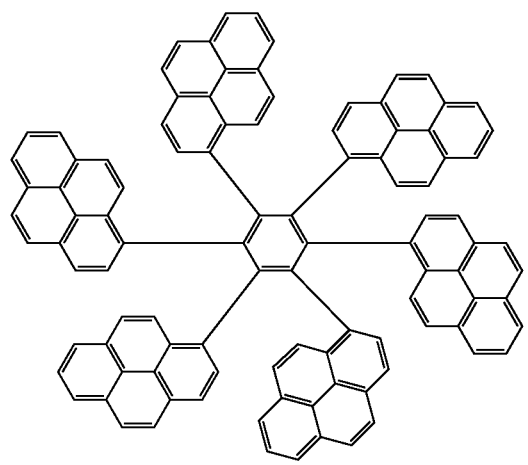
[4]-21
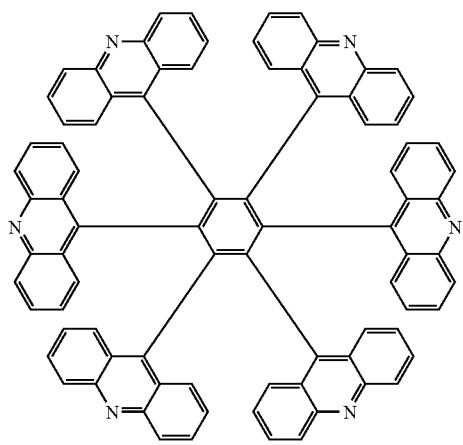
[5]
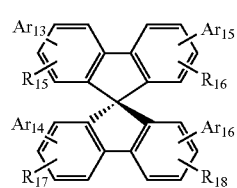
[5]-1
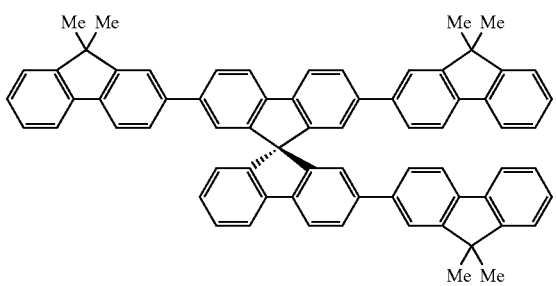
[5]-2
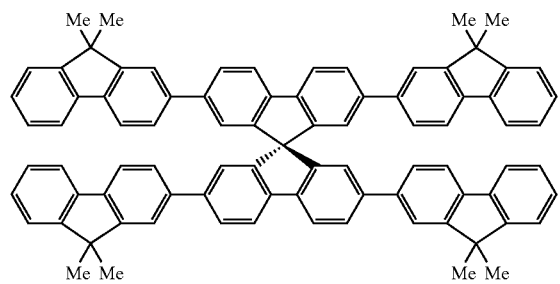
[5]-3
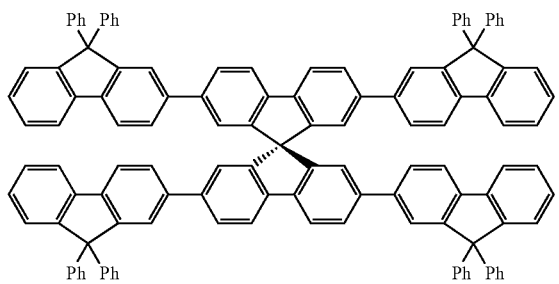
[5]-4
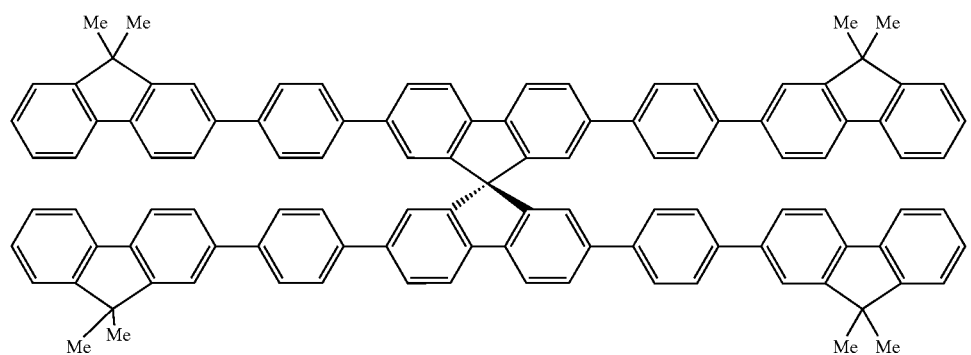

[5]-5
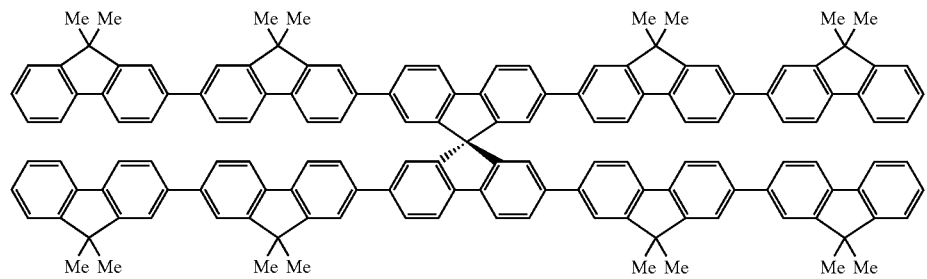
[5]-6
[5]-7
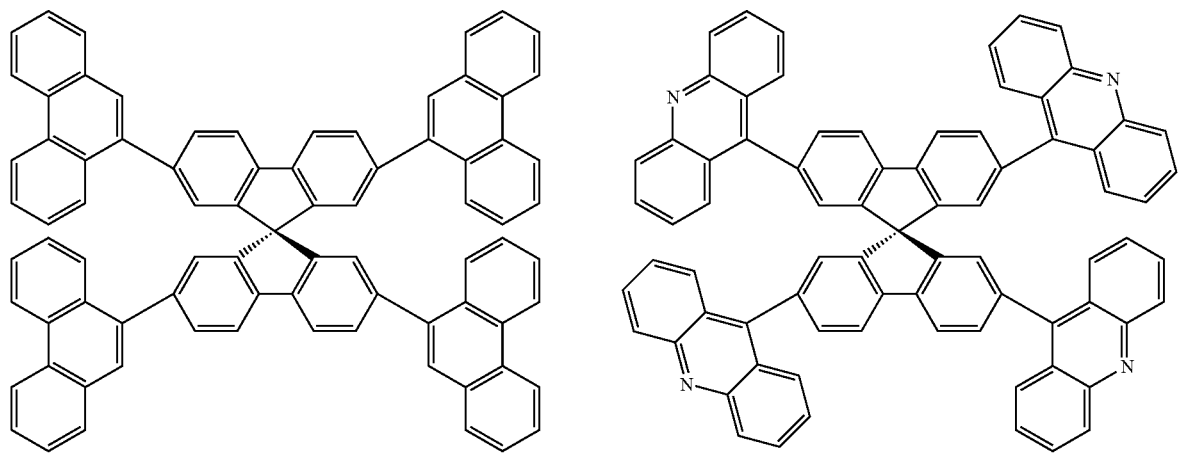
[5]-8
[5]-9
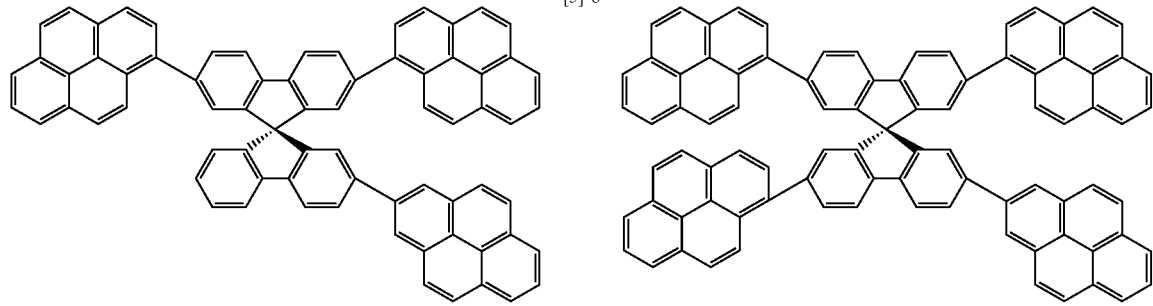
[5]-10
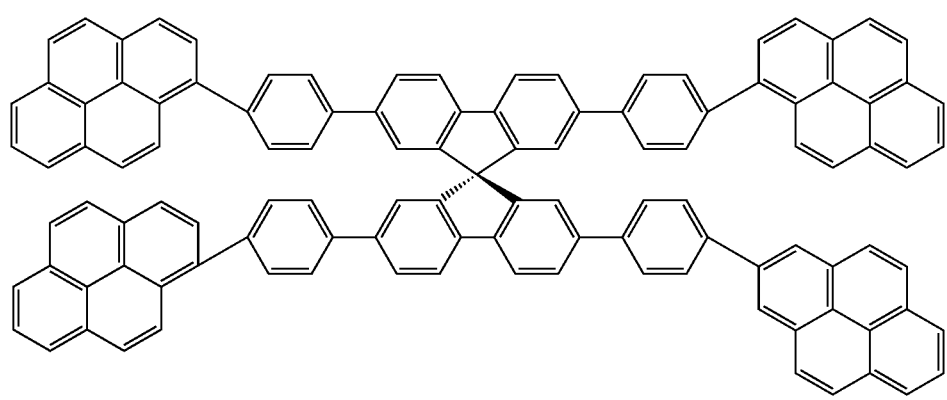

-continued
[5]-11
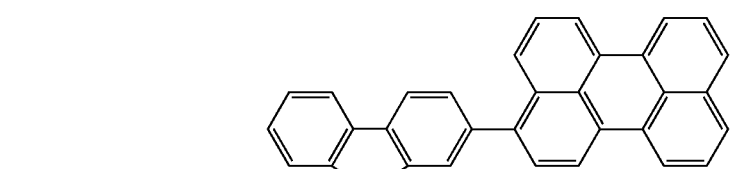
[5]-12
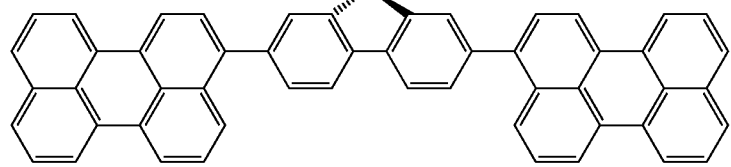
[5]-13
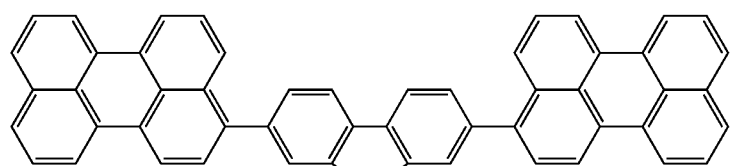
[5]-14
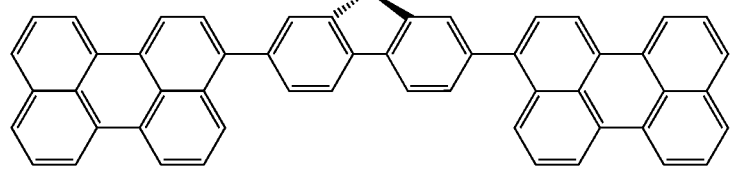
[6]
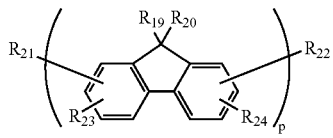
[6]-1
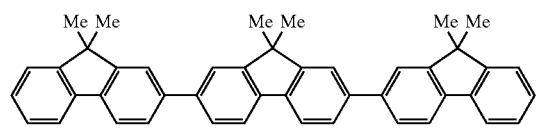
[6]-2
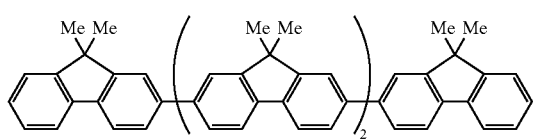

-continued

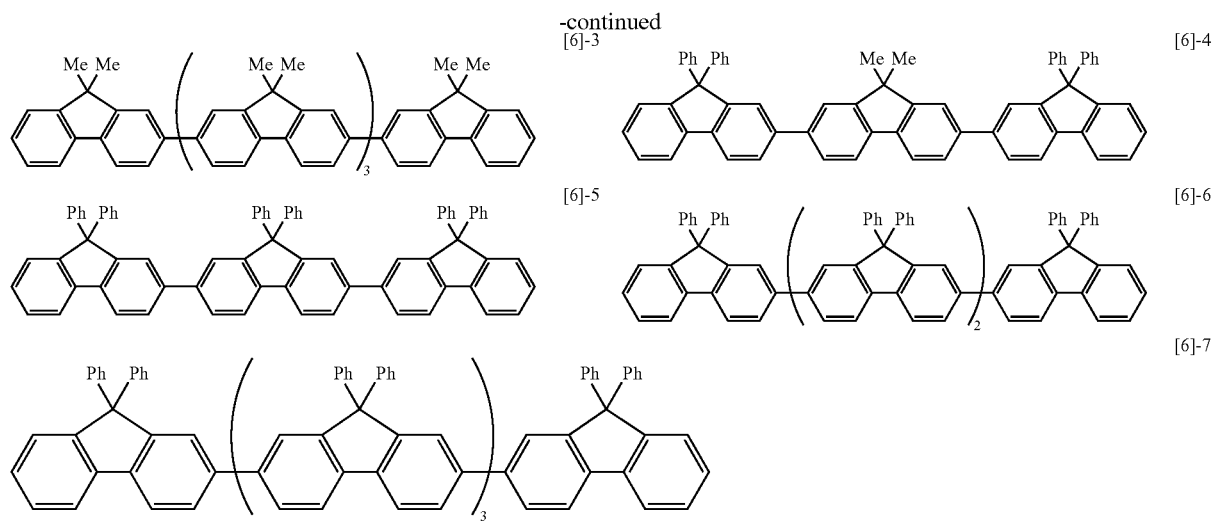

[6]-3
[6]-4
[6]-5
[6]-6
[6]-7

FIGS. 1 to 6 illustrate preferred examples of the organic light-emitting devices of the present invention.

The example of FIG. 1 shows one example having a structure in which an anode 2, a light-emitting layer 3 and a cathode 4 are provided on substrate 1 in this order. The light-emitting device of this example is useful when it possesses a hole-transporting capability, an electron-transporting capability and light-emitting performance singly by itself, or when compounds possessing them respectively are mixed for use.

Figure 2:
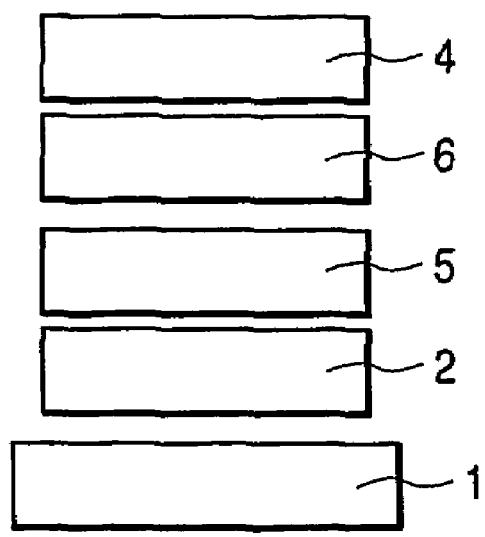
FIG. 2 is a sectional view illustrating another example of the organic light-emitting device according to the present invention.

The example of FIG. 2 has the structure in which an anode 2, a hole-transporting layer 5, an electron-transporting layer 6 and a cathode 4 are provided on substrate 1 in this order. This example is useful when a material having a hole-transporting capability and/or an electron-transporting capability is used for their respective layers and a light-emitting substance in combination with a mere hole-transporting substance or an electron-transporting substance having no light-emitting property. In this case, the light-emitting layer is comprised of hole-transporting layer 5 or electron-transporting layer 6.

Figure 3:
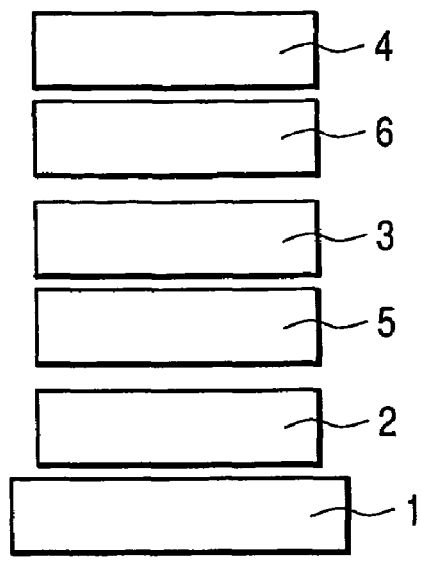
FIG. 3 is a sectional view illustrating another example of the organic light-emitting device according to the present invention.

The example of FIG. 3 has the structure in which an anode 2, a hole-transporting layer 5, a light-emitting layer 3, an electron-transporting layer 6 and a cathode 4 are provided on a substrate 1 in this order, a carrier-transporting function and a light-emitting function being separated. The separation of the light-emitting layer from the charge-transporting layers extremely increases the freedom of material selection since compounds having a hole-transporting property, an electron-transporting property or a light-emitting property can be used in a suitable combination. For example, various compounds having different light-emitting wavelengths can be used to allow diversification of the hue of light emission. Further, it is also possible to try to improve the efficiency of light emission by effectively confining each carrier or exciton in the central light-emitting layer 3.

Figure 4:
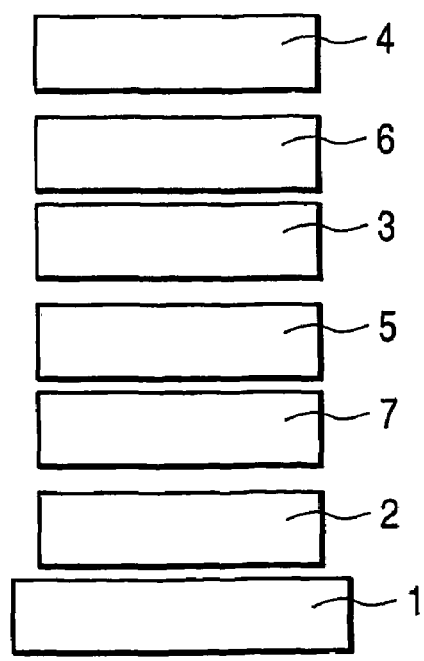
FIG. 4 is a sectional view illustrating another example of the organic light-emitting device according to the present invention.

The example of FIG. 4 has the structure in which a hole-injecting layer 7 is arranged between anode 2 and hole-transporting layer 5 in the form of FIG. 3, which is effective in improving adhesiveness of anode 2 to hole-transporting layer 5, improving a hole-injecting property, being effective to reduce voltage.

Figure 5:
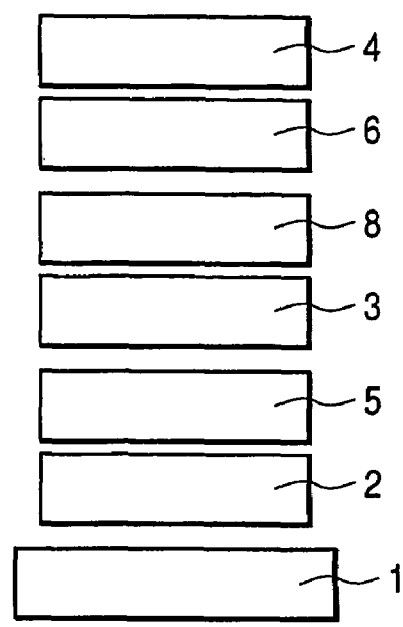
FIG. 5 is a sectional view illustrating another example of the organic light-emitting device according to the present invention.
Figure 6:
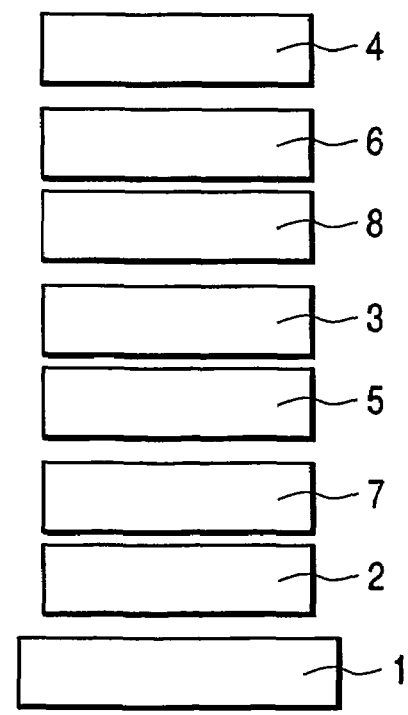
FIG. 6 is a sectional view illustrating another example of the organic light-emitting device according to the present invention.

Examples of FIGS. 5 and 6 have the structure in which a layer for blocking a hole or an exciton from passing through to the side of the cathode 4 (hole-blocking layer 8) is inserted between light-emitting layer 3 and electron-transporting layer 6 in the forms of FIGS. 3 and 4. The use of a compound having a very high ionization potential as the hole-blocking layer 8 is an effective for improving the efficiency of light-emission in the structure.

Examples shown in FIGS. 1 to 6 are very basic device structures, and the structures of the organic light-emitting device using the compounds of the present invention are not limited to them. It is possible to take various laminated structure, for example, to provide an insulating layer to an interface between an electrode and an organic layer, to provide an adhesion layer or an interference layer or to compose the hole-transporting layer from two layers having different ionization potentials.

The compounds represented by general formulas [1] to [6] for use in the present invention can be used in any forms in FIGS. 1 to 6.

In particular, the organic layer using the compounds of the present invention is useful as a light-emitting layer, an electron-transporting layer or a hole-transporting layer. In addition, the layer formed by a vacuum deposition process or a solution coating process hardly causes crystallization or the like and is excellent in the stability with time.

Although the present invention uses the compounds represented by the general formulas [1] to [6] as constituent components especially for the light-emitting layer, already known hole-transporting compounds, light-emitting compounds or electron-transporting compounds can also be used together as necessary.

Examples of these compounds include the followings:

Hole-Transporting Compounds

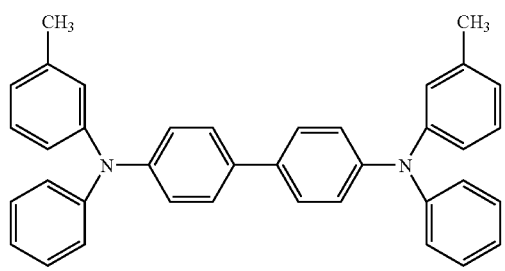

TPD

-continued
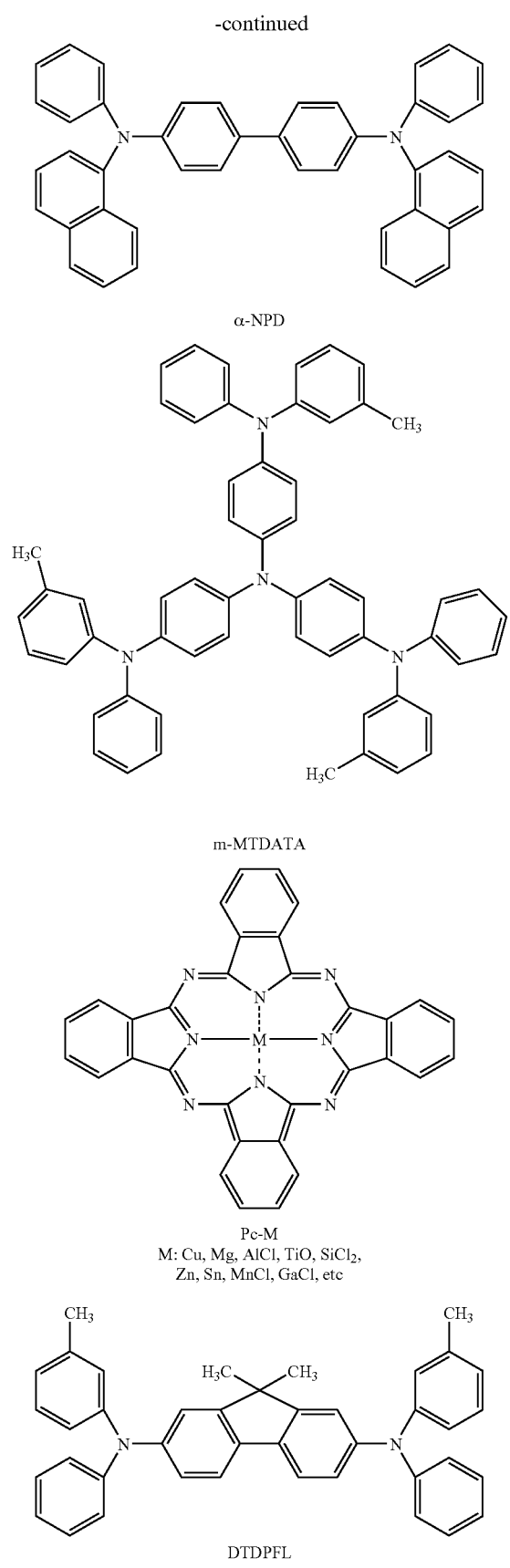
α-NPD
m-MTDATA
Pc-M
M: Cu, Mg, AlCl, TiO, SiCl₂,
Zn, Sn, MnCl, GaCl, etc
DTDPFL
-continued
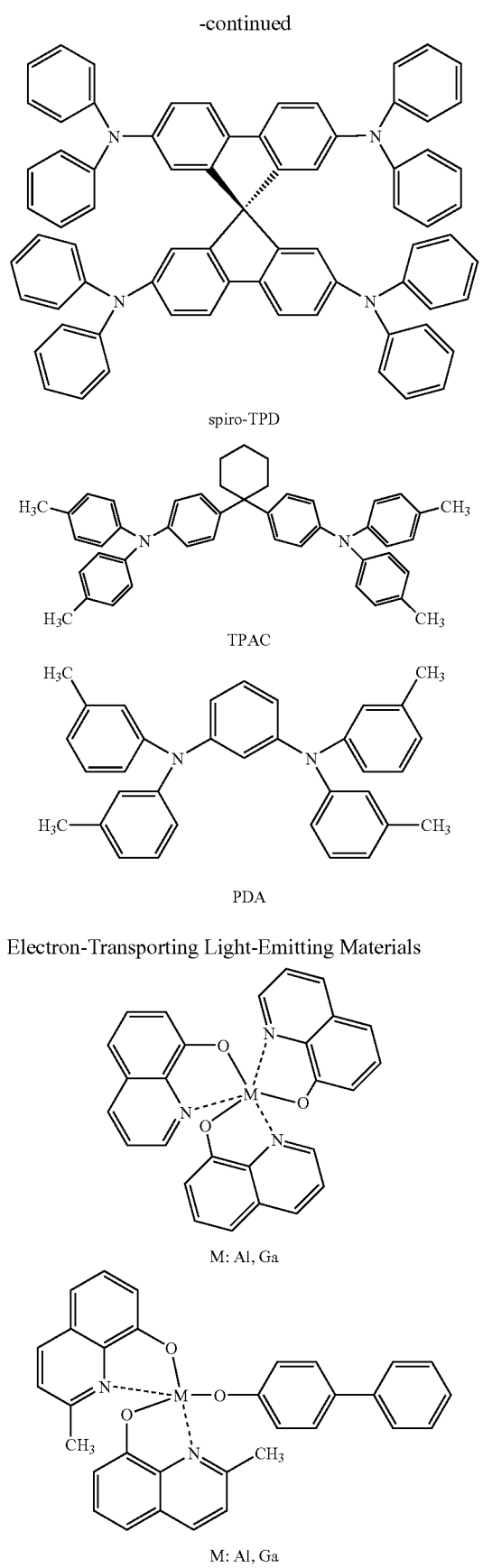
spiro-TPD
TPAC
PDA
Electron-Transporting Light-Emitting Materials
M: Al, Ga
M: Al, Ga -continued
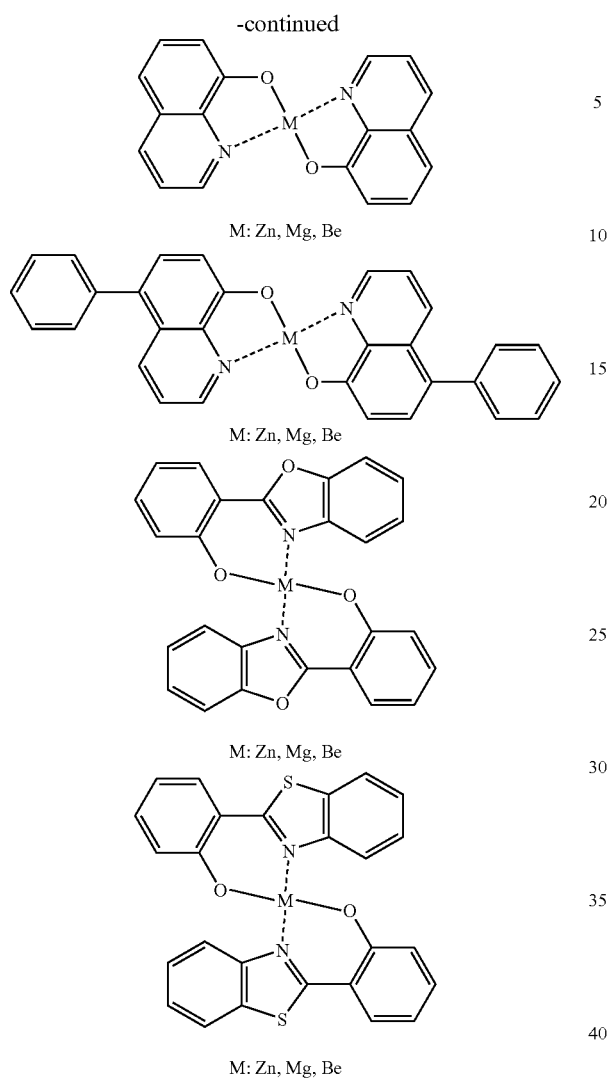
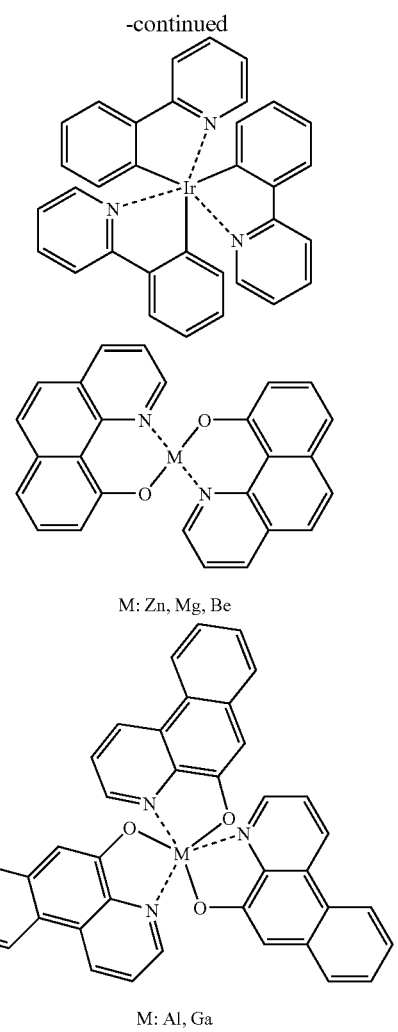
Light-Emitting Materials
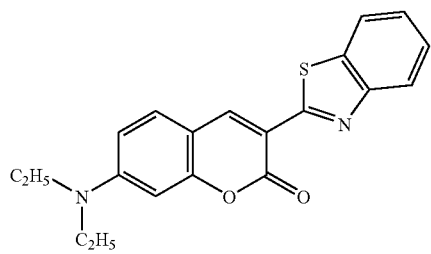
Coumarin6
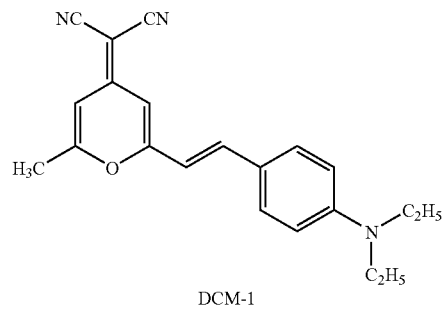
DCM-1
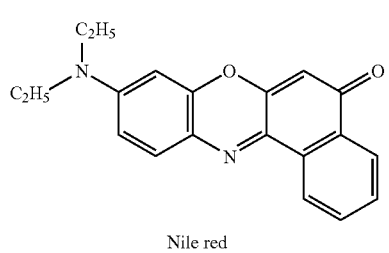
Nile red
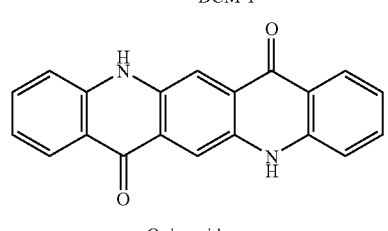
Quinacridone

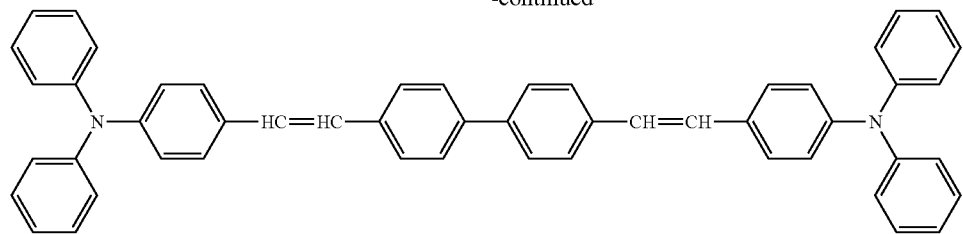
DTPABVi
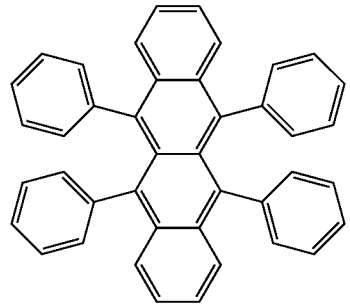
Rubrene
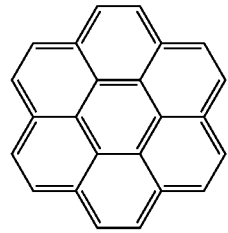
Coronene
Light-Emitting Layer Matrix Materials and Electron-Transporting Materials
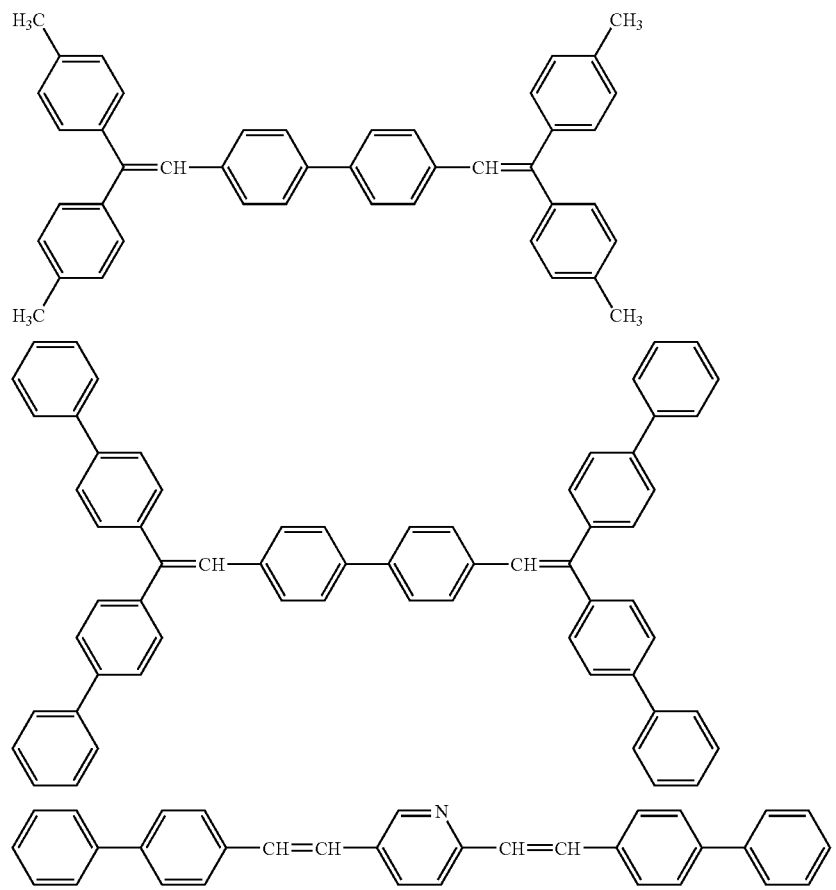

-continued
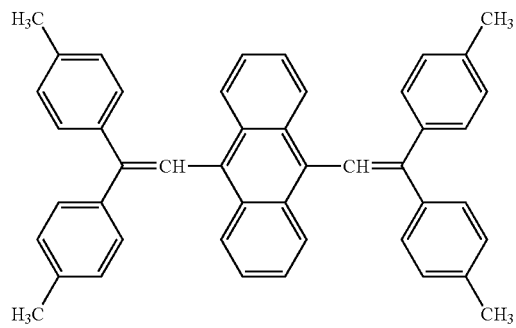
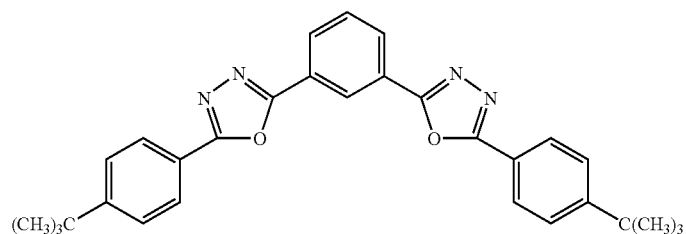
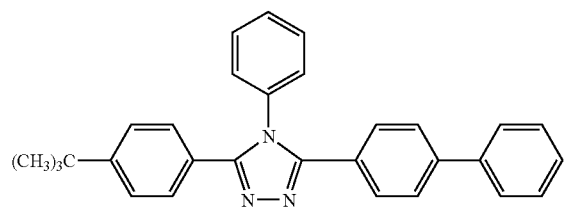
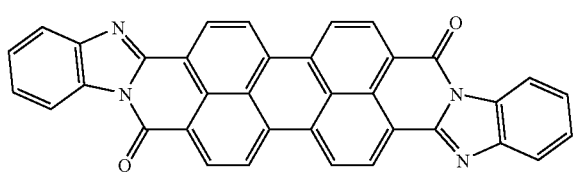
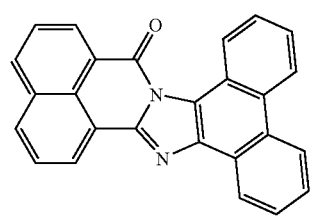
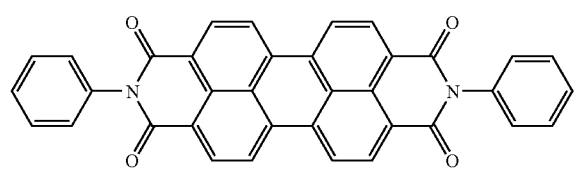
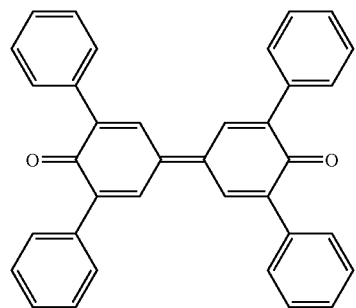

Polymer-Based Hole-Transporting
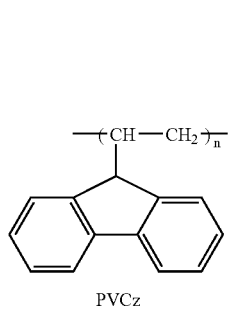
PVCz
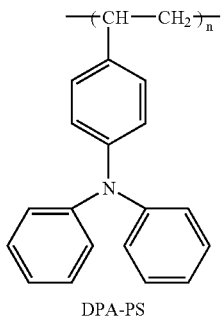
DPA-PS
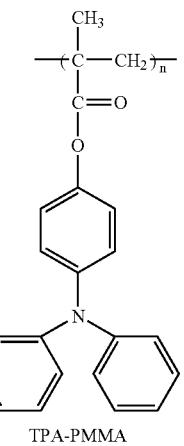
TPA-PMMA
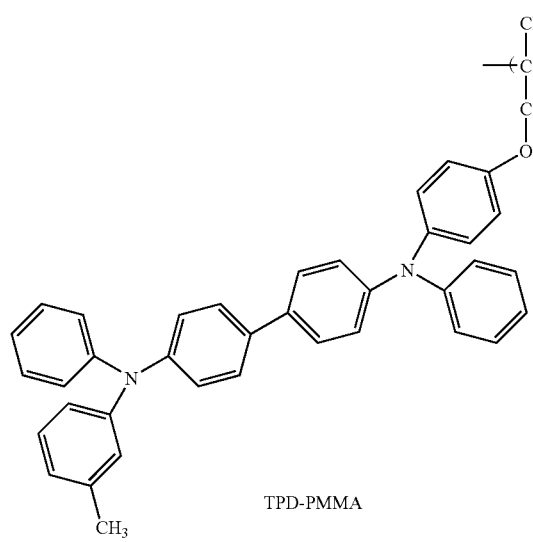
TPD-PMMA
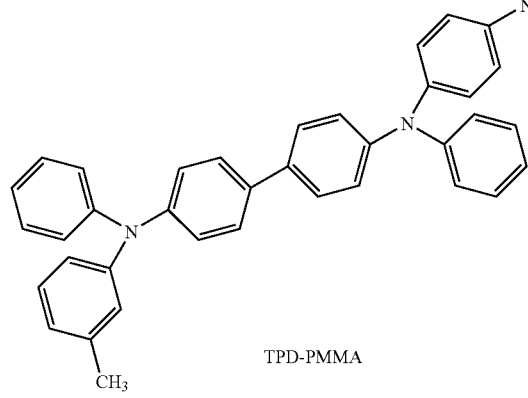
TPD-PMMA

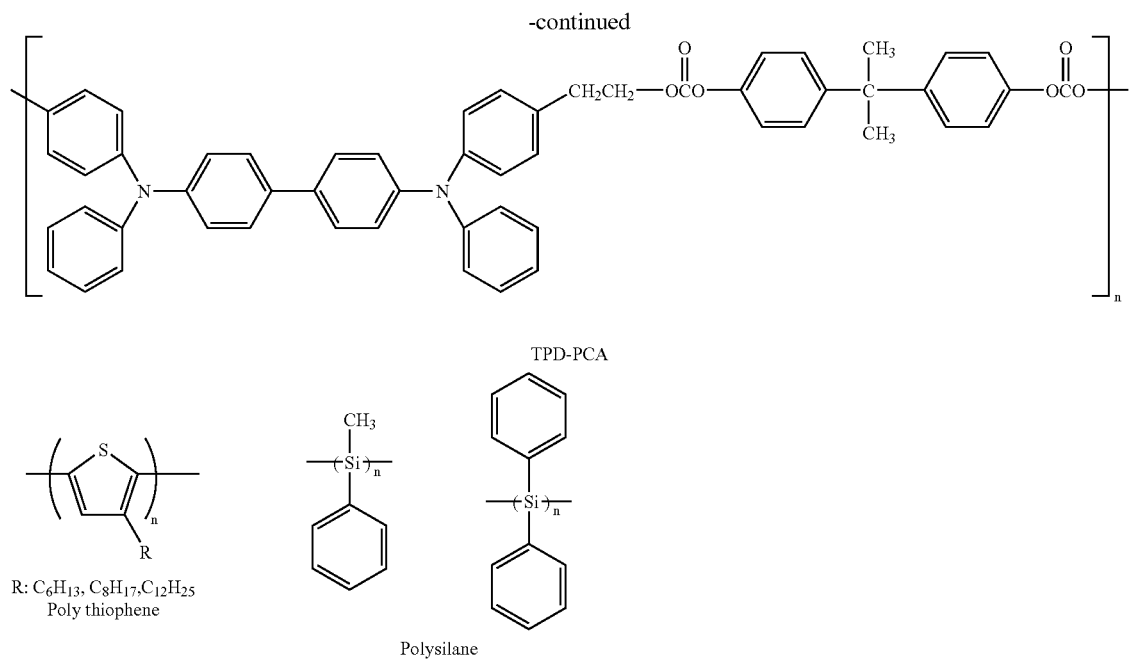

TPD-PCA

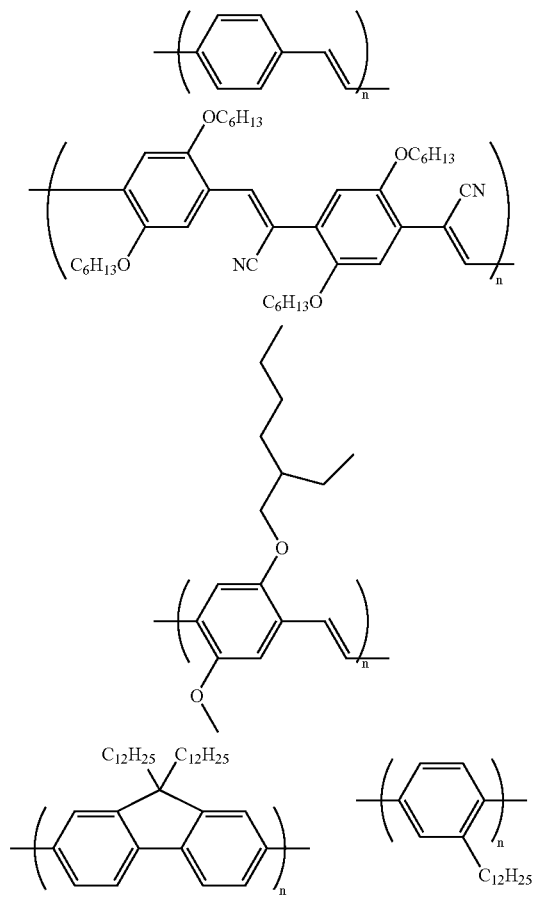

R: $C_6H_{13}$, $C_8H_{17}$, $C_{12}H_{25}$
Poly thiophene

Polysilane

Polymer-Based Light-Emitting Materials and Charge-Transporting Materials

In the organic light-emitting device of the present invention, the layers containing the compounds represented by the general formulas [1] to [6] and the layers comprising other organic compounds are generally formed into thin films by a vacuum deposition process or a coating process in which they are dissolved in a suitable solvent. In particular, when the film is formed by the coating process, it is also possible to form the film in combination with suitable binding resins.

The above described binding resins can be selected from a wide range of binding resins, and include, but not limited to, polyvinylcarbazole resins, polycarbonate resins, polyester resins, polyallylate resins, polystyrene resins, acrylic resins, methacrylic resins, butyral resins, polyvinylacetal resins, diallylphthalate resins, phenol resins, epoxy resins, silicone resins, polysulfone resins, urea resins and the like. In addition, one of them or a mixture of two or more of them may be used in the form of a homopolymer or a copolymer.

The materials for the anode preferably have a large work function, and elemental metals such as gold, platinum, nickel, palladium, cobalt, serene, vanadium and alloys thereof and metal oxides such as tin oxides, zinc oxides, indium tin oxides (ITO) and indium zinc oxides can be used. In addition, conductive polymers such as polyaniline, polypyrrole, polythiophene and poyphenylene sulfide can be used. These electrode materials can be used singly or in combination.

The materials for the cathode preferably have a small work function, and elemental metals such as lithium, sodium, potassium, calcium, magnesium, aluminum, indium, silver, lead, tin and chrome and alloys thereof can be used. Metal oxides such as indium tin oxides (ITO) can also be used. Moreover, the cathode may have one-layered structure or may have a multilayered structure.

The substrates for use in the present invention include, but not limited to, metal substrates, opaque substrates such as ceramic substrates, transparent substrates such as glass, quartz and plastic sheet. Moreover, it is possible to control the color of emitted light using a color filter film, a fluorescent color conversion filter film, a dielectric reflecting film and the like for the substrate.

Furthermore, a protective layer or a sealing layer can also be provided to the prepared device for the purpose of preventing contact with oxygen, moisture and the like. The protective layer includes an inorganic material film such as a diamond thin film, a metal oxide or a metal nitride; a polymeric film such as a fluororesin, polyparaxylene, polyethylene, a silicone resin and a polystyrene resin; a photo-curable resin or the like. Moreover, the device itself can be covered with glass, a gas-impermeable film, metal or the like and packaged with a suitable sealing resin.

EXAMPLES

The present invention will now be described in detail with reference to examples, but the present invention is not limited to them.

Example 1

An organic light-emitting device having the structure shown in FIG. 3 was prepared in a method illustrated below.

On a glass substrate as substrate 1, indium tin oxide (ITO) of 120 nm in thickness as anode 2 was deposited by a sputtering process and ultrasonically cleaned with acetone and isopropyl alcohol (IPA) in this order, and dried by boiling with IPA after the cleaning. Further, it was cleaned with UV/ozone. The resultant structure is referred to a transparent conductive supporting substrate.

There was prepared a 0.5% by weight chloroform solution of the compound represented by the following structural formula:

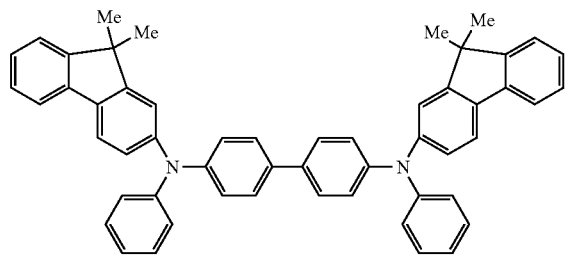

The solution was dropped on the ITO electrode (anode 2) of the transparent conductive supporting substrate, and was subjected to a spin coating first at a revolution of 500 RPM for 10 seconds and then at a revolution of 1,000 RPM for one minute to form a film. It was dried in a vacuum oven at 80° C. for 10 minutes to completely remove the solvent in the thin film. The formed TPD film (hole-transporting layer 5) had a thickness of 50 nm.

On hole-transporting layer 5 the above illustrated compound No. [1]-6 and the above illustrated compound No. [2]-1 (weight ratio of 5:100) were subjected to co-deposition to provide light-emitting layer 3 of 20 nm. As for the conditions, the degree of vacuum at the deposition was $1.0 \times 10^{-4}$ Pa and the speed of deposition was 0.2 to 0.3 nm/sec. Moreover, aluminum-quinolinol (Alq3) was deposited by a vacuum deposition process in a thickness of 40 nm to form electron-transporting layer 6. As for the conditions for depositing these organic layers, the degree of vacuum at the deposition was $1.0 \times 10^{-4}$ Pa and the speed of deposition was 0.2 to 0.3 nm/sec.

Next, a vapor deposition material comprised of an aluminum-lithium alloy (lithium concentration of 1 atomic %) was used to form a metal layer film having a thickness of 10 nm on electron-transporting layer 6 by a vacuum deposition process, and further by the vacuum deposition process an aluminum layer having a thickness of 150 nm was provided to form an electron-injecting electrode (cathode 4). As for the conditions, the degree of vacuum at the vapor deposition was $1.0 \times 10^{-4}$ Pa and the speed of deposition was 1.0 to 1.2 nm/sec.

The resultant structure was covered with a protective glass plate and sealed with an acrylic resin-based adhesive material in a dry air atmosphere to prevent the degradation of the device due to moisture absorption.

When the thus obtained organic EL device was applied with a direct-current voltage of 9 V using an ITO electrode (anode 2) as a positive electrode and an Al—Li electrode (cathode 4) as a negative electrode, the emission of blue light having an emission luminance of 1,250 cd/m², a maximum luminance of 3,770 cd/m² and a luminous efficiency of 0.45 lm/W was observed.

Examples 2 to 7

Devices were prepared and evaluated in the same manner as in Example 1-except that illustrated compounds shown in Table 6 replaced the illustrated compound [1]-6. The results are shown in Table 6.

TABLE 6

| Example | Illustrated compound No. | Applied voltage (V) | Luminance (cd/m²) | Maximum luminance (cd/m²) | Efficiency (lm/W) |
|---|---|---|---|---|---|
| 2 | [1]-34 | 9 | 1670 | 5200 | 0.60 |
| 3 | [1]-41 | 8 | 1840 | 6150 | 0.65 |
| 4 | [1]-46 | 9 | 1730 | 5480 | 0.60 |
| 5 | [1]-57 | 9 | 2050 | 6990 | 0.67 |
| 6 | [1]-64 | 8 | 2200 | 7270 | 0.72 |
| 7 | [1]-66 | 8 | 2600 | 7700 | 0.85 |

Example 8

A device was prepared in the same manner as in Example 1 except that the above illustrated compound No. [1]-41 and the above illustrated compound No. [2]-15 (weight ratio of 5:100) replaced the above illustrated compound No. [1]-6 and the above illustrated compound No. [2]-1 respectively to be subjected to the co-deposition to provide light-emitting layer 3 of 20 nm.

When the obtained device was applied with a direct-current voltage of 9 V using an ITO electrode (anode 2) as a positive electrode and an Al—Li electrode (cathode 4) as a negative electrode, the emission of blue light having an emission luminance of 1,680 cd/m², a maximum luminance of 4,650 cd/m² and a luminous efficiency of 0.57 lm/W was observed.

Example 9

A device was prepared in the same manner as in Example 8 except that the illustrated compound No. [1]-57 replaced the illustrated compound No. [1]-41.

When the obtained device was applied with a direct-current voltage of 9 V using an ITO electrode (anode 2) as a positive electrode and an Al—Li electrode (cathode 4) as a negative electrode, the emission of blue light having an emission luminance of 1,850 cd/m$^2$, a maximum luminance of 4,950 cd/m$^2$ and a luminous efficiency of 0.58 lm/W was observed.

Example 10

A device was prepared in the same manner as in Example 1 except that the above illustrated compound No. [1]-41 and the above illustrated compound No. [3]-1 (weight ratio of 5:100) replaced the above illustrated compound No. [1]-6 and the above illustrated compound No. [2]-1 respectively to be subjected to the co-deposition to provide light-emitting layer 3 of 20 nm.

When the obtained device was applied with a direct-current voltage of 8 V using an ITO electrode (anode 2) as a positive electrode and an Al—Li electrode (cathode 4) as a negative electrode, the emission of blue light having an emission luminance of 2,150 cd/m$^2$, a maximum luminance of 6,840 cd/m$^2$ and a luminous efficiency of 0.71 lm/W was observed.

Example 11

A device was prepared in the same manner as in Example 10 except that the illustrated compound No. [1]-39 replaced the illustrated compound No. [1]-41.

When the obtained device was applied with a direct-current voltage of 8 V using an ITO electrode (anode 2) as a positive electrode and an Al—Li electrode (cathode 4) as a negative electrode, the emission of blue light having an emission luminance of 2,370 cd/m$^2$, a maximum luminance of 7,320 cd/m$^2$ and a luminous efficiency of 0.73 lm/W was observed.

Example 12

A device was prepared in the same manner as in Example 1 except that the above illustrated compound No. [1]-46 and the above illustrated compound No. [4]-1 (weight ratio of 5:100) replaced the above illustrated compound No. [1]-6 and the above illustrated compound No. [2]-1 respectively to be subjected to the co-deposition to provide light-emitting layer 3 of 20 nm.

When the obtained device was applied with a direct-current voltage of 8 V using an ITO electrode (anode 2) as a positive electrode and an Al—Li electrode (cathode 4) as a negative electrode, the emission of blue light having an emission luminance of 2,200 cd/m$^2$, a maximum luminance of 6,760 cd/m$^2$ and a luminous efficiency of 0.72 lm/W was observed.

Example 13

A device was prepared in the same manner as in Example 1 except that the above illustrated compound No. [1]-41 and the above illustrated compound No. [5]-2 (weight ratio of 5:100) replaced the above illustrated compound No. [1]-6 and the above illustrated compound No. [2]-1 respectively to be subjected to the co-deposition to provide light-emitting layer 3 of 20 nm.

When the obtained device was applied with a direct-current voltage of 8 V using an ITO electrode (anode 2) as a positive electrode and an Al—Li electrode (cathode 4) as a negative electrode, the emission of blue light having an emission luminance of 3,100 cd/m$^2$, a maximum luminance of 7,250 cd/m$^2$ and a luminous efficiency of 1.02 lm/W was observed.

Example 14

A device was prepared in the same manner as in Example 1 except that the above illustrated compound No. [1]-39 and the above illustrated compound No. [5]-9 (weight ratio of 5:100) replaced the above illustrated compound No. [1]-6 and the above illustrated compound No. [2]-1 respectively to be subjected to the co-deposition to provide light-emitting layer 3 of 20 nm.

When the obtained device was applied with a direct-current voltage of 8 V using an ITO electrode (anode 2) as a positive electrode and an Al—Li electrode (cathode 4) as a negative electrode, the emission of blue light having an emission luminance of 4,500 cd/m$^2$, a maximum luminance of 8,420 cd/m$^2$ and a luminous efficiency of 1.18 lm/W was observed.

Example 15

A device was prepared in the same manner as in Example 1 except that the above illustrated compound No. [1]-57 and the above illustrated compound No. [6]-1 (weight ratio of 5:100) replaced the above illustrated compound No. [1]-6 and the above illustrated compound No. [2]-1 respectively to be subjected to the co-deposition to provide light-emitting layer 3 of 20 nm.

When the obtained device was applied with a direct-current voltage of 9 V using an ITO electrode (anode 2) as a positive electrode and an Al—Li electrode (cathode 4) as a negative electrode, the emission of blue light having an emission luminance of 1,980 cd/m$^2$, a maximum luminance of 5,300 cd/m$^2$ and a luminous efficiency of 0.60 lm/W was observed.

Examples 16 to 21

The emission spectra of the devices prepared according to Examples 2, 5, 10, 12, 14 and 15 were observed with the MCPD-7000 and the CIE chromaticity coordinates were determined. The results are shown in Table 7.

TABLE 7

| Example | Example for device | CIE color coordinates (x, y) |
|---|---|---|
| 16 | 2 | 0.15, 0.07 |
| 17 | 5 | 0.15, 0.10 |
| 18 | 10 | 0.15, 0.09 |
| 19 | 12 | 0.15, 0.10 |
| 20 | 14 | 0.16, 0.11 |
| 21 | 18 | 0.15, 0.10 |

Example 22

When the voltage was applied to the device prepared in Example 13 for 100 hours while maintaining the current density at 7.0 mA/cm$^2$ in a nitrogen atmosphere, the initial luminance of 480 cd/m$^2$ dropped to 410 cd/m$^2$ after 100 hours, exhibiting only a small reduction of luminance.

Comparative Example 1

A device was prepared in the same manner as in Example 1 except that, as light-emitting layer 3, there was used the following styryl compound:

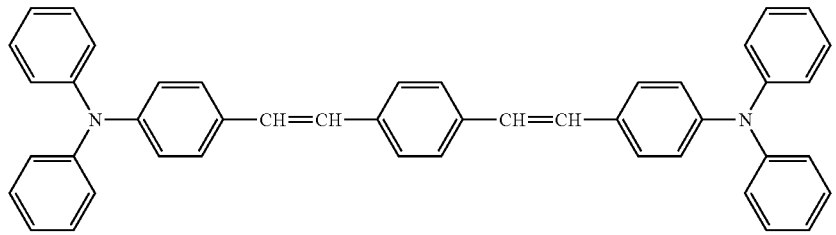

When the obtained device was applied with a direct-current voltage of 10 V using an ITO electrode (anode 2) as a positive electrode and an Al—Li electrode (cathode 4) as a negative electrode, the emission of greenish blue white light having an emission luminance of 120 cd/m$^2$, a maximum luminance of 3,800 cd/m$^2$ and a luminous efficiency of 0.17 lm/W was observed.

Comparative Example 2

A device was prepared in the same manner as in Example 1 except that the styryl compound in Comparative Example 1 and the above illustrated compound No. [4]-1 (weight ratio of 5:100) replaced the above illustrated compound No. [1]-6 and the above illustrated compound No. [2]-1 respectively to be subjected to the co-deposition to provide light-emitting layer 3 of 20 nm.

When the obtained device was applied with a direct-current voltage of 10 V using an ITO electrode (anode 2) as a positive electrode and an Al—Li electrode (cathode 4) as a negative electrode, the emission of greenish blue/white light having an emission luminance of 125 cd/m$^2$, a maximum luminance of 4,500 cd/m$^2$ and a luminous efficiency of 0.30 lm/W was observed.

Comparative Example 3

The emission spectrum of the device prepared according to Comparative Example 2 was observed with the MCPD-7000 and the CIE chromaticity coordinates were determined to be (x, y)=(0.16, 0.30).

As described above by illustrating embodiments and examples, the organic light-emitting devices of the present invention provide the emission having high luminance at a low applied voltage and are also excellent in color purity and durability, as a single layer or a mixed layer of a dopant/host by combining any of [2] to [6] with [1]. Moreover, it is possible to prepare the devices by using a vacuum deposition process, casting process or the like, and the devices having a large area can be prepared easily at a relatively low cost.

The invention claimed is:

1. An organic light-emitting device comprising a pair of electrodes consisting of an anode and a cathode and organic compound-containing layers sandwiched between the pair of electrodes, wherein
   (a) at least one layer of the organic compound-containing layers contains at least one compound selected from the group consisting of compounds represented by the following general formula:

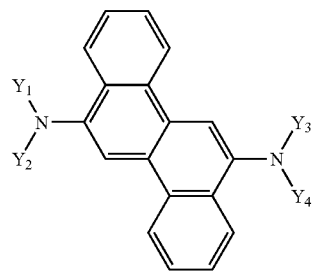

wherein
   $Y_1$ and $Y_3$ can be bonded to $Y_2$ and $Y_4$ respectively to form a ring;
   $Y_1$ to $Y_4$ are the same or different and are each independently a group selected from the group consisting of alkyl, aralkyl, aryl, heterocyclic, amino, silyl, alkylene, aralkylene, alkenylene, imino, —SiH$_2$—, silylene, carbonyl, ether and thioether, each having no substituent or a substituent which can include a linking group consisting of arylene or divalent heterocyclic, each having no substituent or a substitutent; and
   at least one compound selected from the group consisting of compounds represented by the following general formula [6]:

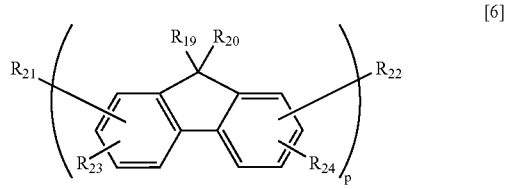

wherein $R_{19}$ and $R_{20}$ are the same or different and are hydrogen or a group selected from the group consisting of a alkyl, aralkyl and aryl, each having no substituent or a substituent; any pair of $R_{19}$ combined to their respective fluorene structures are the same or different to each other; any pair of $R_{20}$ combined to their respective fluorene structures are the same or different to each other; $R_{21}$ to $R_{24}$ are hydrogen, halogen, cyano, a substituted silyl or a group selected from the group consisting of alkyl, aralkyl and alkoxy, each having no substituent or a substituent; and p is an integer from 2 to 10; and
   (b) at least one layer of the organic compound-containing layers is a light-emitting layer.

2. The organic light-emitting device according to claim 1, at least one of $Y_1$ and $Y_2$ is substituted or unsubstituted phenyl; and at least one of $Y_3$ and $Y_4$ is substituted or unsubstituted phenyl.

* * * * *